United States Patent
Itoh

(10) Patent No.: US 6,888,481 B2
(45) Date of Patent: May 3, 2005

(54) D/A CONVERTING DEVICE WITH OFFSET COMPENSATION FUNCTION AND OFFSET COMPENSATION METHOD OF D/A CONVERTING DEVICE

(75) Inventor: Minoru Itoh, Shiga-ken (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/752,040

(22) Filed: Jan. 7, 2004

(65) Prior Publication Data

US 2004/0150541 A1 Aug. 5, 2004

(30) Foreign Application Priority Data

Jan. 10, 2003 (JP) ..................................... P2003-004041
Jun. 13, 2003 (JP) ..................................... P2003-169384

(51) Int. Cl.[7] .............................................. H03M 1/10
(52) U.S. Cl. ....................................... 341/118; 341/120
(58) Field of Search ................................. 341/118, 120

(56) References Cited

U.S. PATENT DOCUMENTS

| | | | | |
|---|---|---|---|---|
| 5,894,280 A | * | 4/1999 | Ginetti et al. ............... | 341/118 |
| 6,100,827 A | | 8/2000 | Boesch et al. | |
| 6,313,769 B1 | * | 11/2001 | Mangahas et al. .......... | 341/118 |
| 2003/0006920 A1 | * | 1/2003 | Mori ......................... | 341/118 |

FOREIGN PATENT DOCUMENTS

| | | | |
|---|---|---|---|
| EP | 0 655 841 A1 | 5/1995 | |
| JP | 7-202693 | 8/1995 | |
| JP | 2003008407 A | * 1/2003 | ............ H03M/1/10 |

OTHER PUBLICATIONS

Millman, J., Microelectronics Digital and Analog Circuits and Systems, 1979, McGraw–Hill Inc., pp. 611–612.*

* cited by examiner

Primary Examiner—Howard L. Williams
(74) Attorney, Agent, or Firm—McDermott Will & Emery LLP

(57) ABSTRACT

An input changing switch is provided at a preceding stage of a comparator that measures a DC offset of a D/A converter, and also a selective polarity inverting circuit is provided at a subsequent stage. A first compensation value is generated by a compensation value generating means and then stored in a register. Then, a second compensation value is generated by switching the input changing switch and the polarity inverting circuit and then stored in a register. Then, a third compensation value is calculated by averaging the first compensation value and the second compensation value by a compensation value calculating circuit. Then, the DC offset of the D/A converter is compensated by using this compensation value. Therefore, it enables to implement a precise DC offset compensation of the D/A converter by canceling the DC offset contained in the comparator itself employed in the DC offset compensation of the D/A converter.

2 Claims, 21 Drawing Sheets

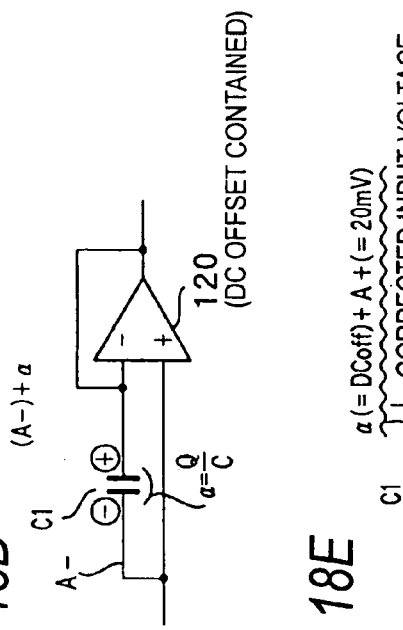
FIG. 18A
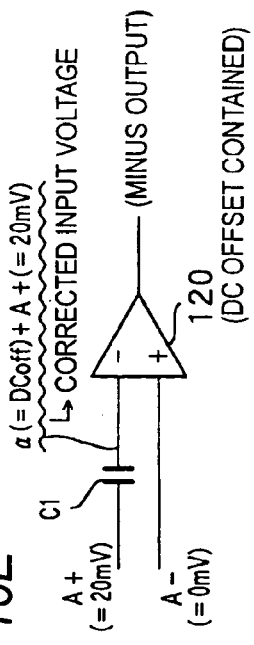
FIG. 18B
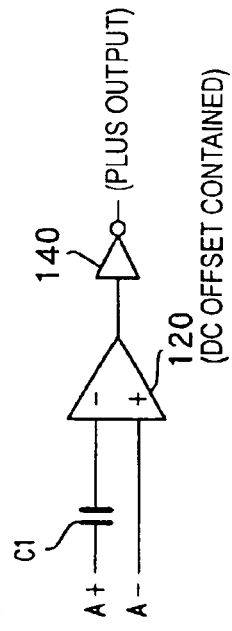
FIG. 18C
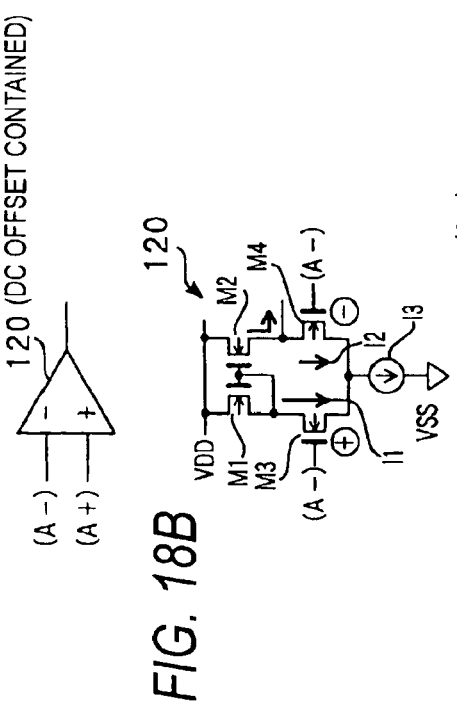
FIG. 18D
FIG. 18E
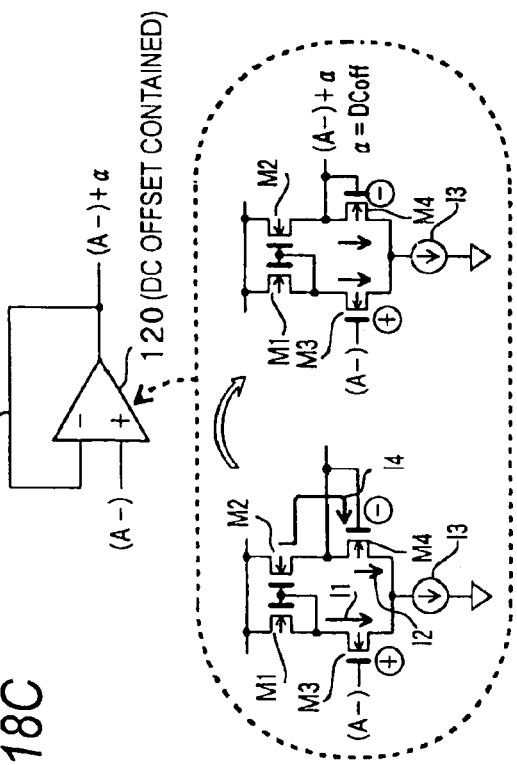
FIG. 18F

FIG. 19B

FIG. 19C  DC OFFSET COMPENSATION VALUE x 2LSB
= DC OFFSET OF D/A CONVERTER (LSB IS SET TO 1mV)
− DC OFFSET OF OP AMPLIFIER (DCoff)

FIG. 19F  DC OFFSET COMPENSATION VALUE x 2LSB
= DC OFFSET OF D/A CONVERTER + DCoff − DCoff
= DC OFFSET OF D/A CONVERTER FIG. 21A
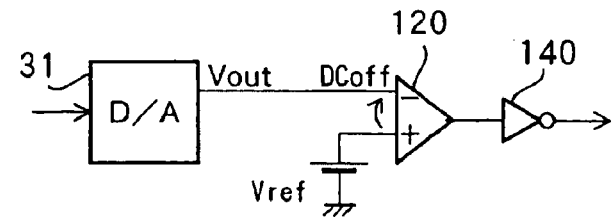
FIG. 21B
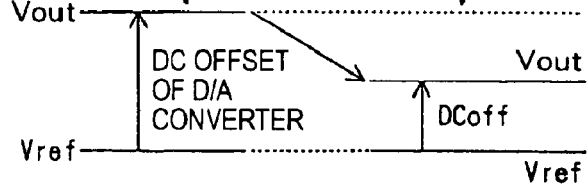
FIG. 21C
DC OFFSET COMPENSATION VALUE x LSB
= DC OFFSET OF D/A CONVERTER
− DC OFFSET OF OP AMPLIFIER (DCoff)
FIG. 21D
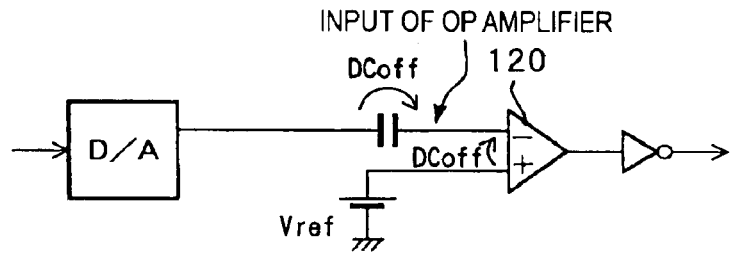
FIG. 21E
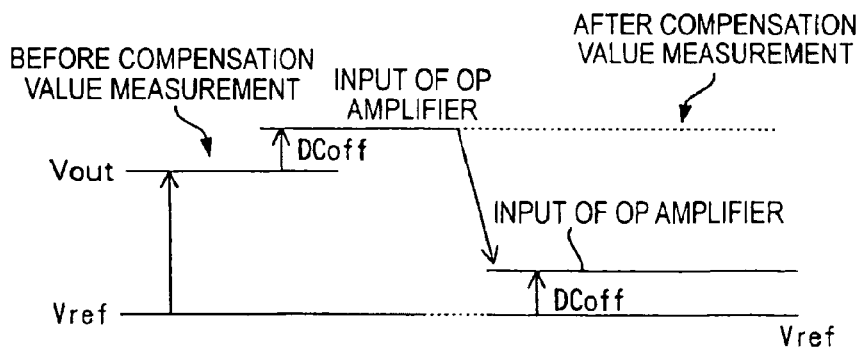
FIG. 21F
DC OFFSET COMPENSATION VALUE x LSB
= DC OFFSET OF D/A CONVERTER + DCoff − DCoff
= DC OFFSET OF D/A CONVERTER

D/A CONVERTING DEVICE WITH OFFSET COMPENSATION FUNCTION AND OFFSET COMPENSATION METHOD OF D/A CONVERTING DEVICE

BACKGROUND OF THE INVENTION

1. Field of the Invention

The present invention relates to a D/A converting device with an offset compensation function and an offset compensation method of the D/A converting device. More particularly, the present invention relates to a device and a method of compensating DC offset of a D/A converter built in a digital radio communication device.

2. Description of the Related Art

In the digital radio communication equipment, respective I(In-phase), Q(Quadrature) signals, which are subjected to the digital modulation, are D/A-converted, then coupled in the radio frequency portion of the radiotelephony, and then sent out from the antenna as the radio signal. Ideally, analog output voltage of the D/A converter should coincide with ideal analog output voltage (analog output voltage without DC offset) that corresponds to digital input value. Actually, the DC offset is generated between the actual analog output voltage and the ideal analog output voltage because of various factors.

In the case of the differential output type D/A converter, if the DC offset is generated between differential outputs (I+ and I−, or Q+ and Q−) of the D/A converter, which correspond to the I signal and the Q signal respectively, (i.e., input/output characteristics of differential outputs of the D/A converter is different), a phase between respective I, Q signals is shifted to generate a transmission error. Therefore, the characteristics of the D/A converters must be made uniform by canceling the DC offset between the differential outputs of the D/A converter.

In order to cancel the DC offset between the differential outputs of the D/A converter, the DC offset between the differential outputs of the D/A converter in response to test data must be measured in a test mode where no input signal is present. For this purpose, a comparator (a voltage comparator) is employed.

In the prior art, the next digital input of the next D/A converter is derived by adding +1 (high level) or −1 (low level), which is obtained on the basis of the result of the voltage comparison executed by the comparator, to the current compensation value (its initial value is 0), and then subtracting the new compensation value from test data. Then, the above procedures are repeated until the polarity of the comparator is inverted. The compensation value obtained when the polarity is inverted gives the compensation value (control data) to compensate the DC offset between the differential outputs of the D/A converter. There is the technology to cancel the DC offset between the differential outputs of the D/A converter by correcting the input data based on this compensation value (see JP-A-7-202693, for example).

JP-A-7-202693 (FIG. 1, FIG. 2, etc.) is known as a related art.

However, the DC offset actually exists in a comparator that detects the DC offset in the D/A converter in a single output type D/A converting device and in a comparator that detects the DC offset between the differential outputs of the D/A converter in a differential output type D/A converting device. Normally, the DC offset of the comparator is designed to be suppressed within several mV.

However, according to the study of the inventor of the present invention, it was confirmed that in some cases the DC offset of the comparator itself is in excess of 20 mV due to variation in transistor size, LSI production process conditions, etc. In particular, the DC offset of the comparator tends to increase as the transistor size is miniaturized.

The DC offset contained in the comparator causes an error in measuring the DC offset (containing the DC offset between the differential outputs) of the D/A converter. As a result, the precise measurement cannot be carried out if the DC offset of the comparator itself is large, and thus the DC offset of the D/A converter cannot be perfectly removed.

SUMMARY OF THE INVENTION

The object of the present invention is to provide a D/A converting device with an offset compensation function and offset compensation method for the D/A converting device, which enable to remove a DC offset of the D/A converter even though a DC offset exists in a comparator.

The invention provides a D/A converting device with an offset compensation function, which has a comparator for detecting the DC offset of the D/A converter; a changing switch for selecting a first input mode in which first and second signals, wherein at least one of these signals is an output signal of the D/A converter, are input into first and second input terminals of the comparator respectively, and a second input mode in which the second and first signals are input into the first and second terminals of the comparator respectively; and input data correcting means for calculating a third compensation value from a first compensation value which is obtained based on an output signal of the comparator in the first input mode and a second compensation value which is obtained based on an output signal of the comparator in the second input mode, and also correcting input data of the D/A converter by using the third compensation value.

According to the device, voltage information that have the value identical to the DC offset contained in the comparator itself and have the inverted polarity are formed indirectly in the first and second compensation values, and the DC offset contained in the comparator itself is canceled when such DC offset of the D/A converter is measured. In other words, for example, the DC offset contained in the comparator itself acts to enlarge a difference between two signals, which are to be input into the comparator, in the first compensation value measured in the first input mode, but such DC offset contained in the comparator itself acts to contract the difference between two signals in the second compensation value measured in the second input mode. That is, the polarity of the DC offset contained in the comparator itself is inverted in the first and second input modes respectively. In contrast, the DC offset of the D/A converter is identical (the polarity is also identical) in the first and second input modes regardless of the switching of the inputs into the comparator. As a result, if the third compensation value is calculated based on the first and second compensation values, which are generated based on respective measured signals before and after the inputs into the comparator are switched, so as to cancel the DC offset component contained in the comparator itself, the precise compensation of the DC offset of the D/A converter can be achieved.

In this way, according to the device, since the compensation value is generated to contain the DC offset of the comparator itself and the DC offset of the D/A converter and then the negative feedback with the compensation value is applied to the input data of the D/A converter, the D/A converting device looks like as a whole such a situation that the DC offset disappeared from the comparator. That is, the DC offset of the D/A converter can be measured by using the comparator from which the DC offset is eliminated substantially, so that such DC offset of the D/A converting device can be removed substantially perfectly.

Furthermore, the input data correcting means calculates the third compensation value by averaging the first compensation value and another second compensation value which is obtained based on an inverted signal of the output signal of the comparator in the second input mode.

According to the device, since the first and second compensation values generated based on respective measured signals in the first and second input modes, i.e., before and after the inputs into the comparator are switched, are added, the DC offset component of the comparator itself is canceled substantially and disappears whereas the DC offset component of the D/A converter is simply doubled. As a result, the compensation value to be applied to the net DC offset of the D/A converter, from which the DC offset of the comparator is removed, can be calculated precisely by dividing the DC offset component of the D/A converter by 2 (i.e., taking an average).

Furthermore, the input data correcting means calculates the third compensation value by averaging the second compensation value and another first compensation value which is obtained based on an inverted signal of the output signal of the comparator in the first input mode.

According to the device, since the first and second compensation values generated based on respective measured signals in the first and second input modes, i.e., before and after the inputs into the comparator are switched, are added, the DC offset component of the comparator itself is canceled substantially and disappears whereas the DC offset component of the D/A converter is simply doubled. As a result, the compensation value to be applied to the net DC offset of the D/A converter, from which the DC offset of the comparator is removed, can be calculated precisely by dividing the DC offset component of the D/A converter by 2 (i.e., taking an average).

Furthermore, the input data correcting means calculates the third compensation value by dividing a difference value between the first compensation value and the second compensation value by 2.

According to the device, since the first and second compensation values are generated based on respective measured signals in the first and second input modes, i.e., before and after the inputs into the comparator are switched, and the difference value between them is calculated, the DC offset component of the comparator itself is canceled substantially and disappears whereas the DC offset component of the D/A converter is simply doubled. As a result, the compensation value to be applied to the net DC offset of the D/A converter, from which the DC offset of the comparator is removed, can be calculated precisely by dividing the DC offset component of the D/A converter by 2.

Furthermore, the input data correcting means calculates the third compensation value by dividing a difference value between another first compensation value which is obtained based on an inverted signal of the output signal of the comparator in the first input mode and another second compensation value which is obtained based on an inverted signal of the output signal of the comparator in the second input mode by 2.

According to the device, since the first and second compensation values are generated based on respective measured signals in the first and second input modes, i.e., before and after the inputs into the comparator are switched, and the difference value between them is calculated, the DC offset component of the comparator itself is canceled substantially and disappears whereas the DC offset component of the D/A converter is simply doubled. As a result, the compensation value to be applied to the net DC offset of the D/A converter, from which the DC offset of the comparator is removed, can be calculated precisely by dividing the DC offset component of the D/A converter by 2.

Furthermore, the D/A converter is of differential output type that outputs two analog signals whose phases are inverted, and the first and second signals are two analog signals which are output from the D/A converter.

According to the device, since the differential output (complementary output) type D/A converter is used to expand a dynamic range of the converter output, the DC offset of the D/A converter can be removed substantially perfectly.

Furthermore, the D/A converter is of single output type, and one of the first and second signals is the output signal of the D/A converter, and the other thereof has a predetermined reference voltage.

According to the device, even if the single output type D/A converter is used, the DC offset of the D/A converter can be removed substantially perfectly.

Furthermore, the input data correcting means determines the first and second compensation values by using a successive approximation method.

According to the device, since the first and second compensation values are calculated by using the successive approximation method, the DC offset of the D/A converter together with the DC offset component of the comparator itself can be calculated precisely.

Furthermore, the input data correcting means determines the first and second compensation values by changing the input data of the D/A converter one bit by one bit.

According to the device, since the first and second compensation values are calculated by changing the input data of the D/A converter with the offset compensation function one bit by one bit, the DC offset of the D/A converter together with the DC offset component of the comparator itself can be calculated precisely.

Furthermore, the input data correcting means determines the first and second compensation values by using the successive approximation method based on a binary search.

According to the device, since the first and second compensation values are calculated by the successive approximation method based on the binary search, shortening of the measuring time can be achieved.

Furthermore, the input data correcting means adds ½ to the first and second compensation values when least significant bits of the first and second compensation values are 0, and subtract ½ from the first and second compensation values when the least significant bits of the first and second compensation values are 1.

According to the device, a precision of the total compensation value applied to the DC offset of the D/A converter and the DC offset component of the comparator itself can be improved.

The invention provided an LSI in which the D/A converting device with the offset compensation function is incorporated.

According to the LSI, reduction in size and lower power consumption of the digital radio transmitter for transmitting respective I, Q signals in which the DC offset is compensated can be achieved.

The invention provides an offset compensation method of a D/A converting device which detects a DC offset of a D/A converter by using a comparator to compensate the DC offset of the D/A converter, includes the steps of: obtaining a first compensation value based on an output signal of the comparator in a first input mode in which first and second signals, wherein at least one of these signals is an output signal of the D/A converter, are input into first and second input terminals of the comparator respectively; obtaining a second compensation value based on an output signal of the comparator in a second input mode in which second and first signals are input into the first and second input terminals of the comparator respectively; calculating a third compensation value from the first compensation value and the second compensation value; and correcting input data of the D/A converter by using the third compensation value.

According to the method, voltage information that have the value identical to the DC offset contained in the comparator itself and have the inverted polarity are formed indirectly, and the third compensation value is calculated to cancel the DC offset of the D/A converter itself when the DC offset of the D/A converter is measured. Therefore, the precise compensation of the DC offset of the D/A converter can be achieved.

Furthermore, the offset compensation method further includes the step of calculating the third compensation value by averaging the first compensation value and another second compensation value which is obtained based on an inverted signal of the output signal of the comparator in the second input mode.

According to the method, since an average of the first and second compensation values generated based on respective measured signals in the first and second input modes, i.e., before and after the inputs into the comparator are switched, is taken, the third compensation value to be applied to the net DC offset of the D/A converter, from which the DC offset of the comparator is removed, can be calculated precisely.

Furthermore, the offset compensation method further includes the step of calculating the third compensation value by averaging the second compensation value and another first compensation value which is obtained based on an inverted signal of the output signal of the comparator in the first input mode.

According to the method, since the average of the first and second compensation values generated based on respective measured signals in the first and second input modes, i.e., before and after the inputs into the comparator are switched, is taken, the third compensation value to be applied to the net DC offset of the D/A converter, from which the DC offset of the comparator is removed, can be calculated precisely.

Furthermore, the offset compensation method further includes the step of calculating the third compensation value by dividing a difference value between the first compensation value and the second compensation value by 2.

According to the method, since a difference value between the first and second compensation values generated based on respective measured signals in the first and second input modes, i.e., before and after the inputs into the comparator are switched, are divided by 2, the third compensation value to be applied to the net DC offset of the D/A converter, from which the DC offset of the comparator is removed, can be calculated precisely.

Furthermore, the offset compensation method further includes the steps of obtaining another first compensation value and another second compensation value based on an inverted signal of the output signal of the comparator in the first and second input modes respectively; and calculating the third compensation value by dividing a difference value between the another first compensation value and the another second compensation value by 2.

According to the method, since a difference value between the first and second compensation values generated based on respective measured signals in the first and second input modes, i.e., before and after the inputs into the comparator are switched, are divided by 2, the third compensation value to be applied to the net DC offset of the D/A converter, from which the DC offset of the comparator is removed, can be calculated precisely.

The invention provides an analog signal outputting device which uses the D/A converting device with the offset compensation function.

Also, in another mode of the present invention, the DC offset of the comparator itself is canceled by employing the analog approach using the OP amplifier, the inverter, and the capacitor, and then the compensation value is generated by measuring the DC offset of the D/A converter.

More particularly, a path for feeding back the output signal of the OP amplifier to the inverting terminal is provided, and then conduction/non-conduction of this path is controlled by the first switch. Also, one end of the capacitor is connected to the inverting terminal of the comparator, and then the second switch controls the other end of the capacitor such that the other end is connected to the non-inverting terminal of the comparator or disconnected from the non-inverting terminal.

Then, first the OP amplifier is constructed as a voltage follower by turning ON the first switch, and the other end of the capacitor is connected to the non-inverting terminal of the OP amplifier by using the second switch to maintain a connection point at a predetermined potential (first potential). Accordingly, the voltage equivalent to the DC offset of the OP amplifier is generated across the capacitor.

Then, the voltage follower configuration is released and the other end of the capacitor is opened. Then, when the potential to measure the DC offset of the D/A converter is connected to the other end, the input voltage is corrected by the voltage accumulated in the capacitor. As a result, the DC offset of the OP amplifier is canceled.

BRIEF DESCRIPTION OF THE DRAWINGS

FIG. 18A is a view showing the OP amplifier having the DC offset;

FIG. 18B is a view showing a state of a differential circuit in the OP amplifier having the DC offset;

FIG. 18C is a view showing potentials of respective portions of the OP amplifier and a state of a differential circuit in the OP amplifier when the OP amplifier is constructed as a voltage follower;

FIG. 18D is a view showing potentials of respective portions in a mode in which a capacitor is connected to the inverting terminal of the OP amplifier constructed as the voltage follower;

FIG. 18E is a view showing an output voltage when an input analog voltage into the inverting terminal of the OP amplifier is corrected and then the corrected voltage is supplied to the OP amplifier;

FIG. 18F is a view showing an output voltage when an output of the OP amplifier is inverted by an inverter;

FIG. 19B and FIG. 19C are views showing the event that the DC offset compensation value of the D/A converter× 2LSB is the DC offset of the D/A converter-DCoff;

FIG. 19E and FIG. 19F are views showing the event that the DC offset compensation value of the D/A converter× 2LSB is equal to the DC offset of the D/A converter;

FIG. 21A is a view showing circuit connections when the DC offset compensation function is not provided to the comparator used to measure the DC offset of the D/A converter;

FIG. 21B and FIG. 21C are views showing the event that the DC offset compensation value of the D/A converter× LSB is the DC offset of the D/A converter-DCoff;

FIG. 21D is a view showing circuit connections when the DC offset compensation function is provided to the comparator used to measure the DC offset of the D/A converter; and FIG. 21E and FIG. 21F are views showing the event that the DC offset compensation value of the D/A converter× LSB is equal to the DC offset of the D/A converter.

DETAILED DESCRIPTION OF THE PREFERRED EMBODIMENTS

Embodiments of the present invention will be explained with reference to the drawings hereinafter. But explanations given in the following should not be interpreted to limit the scope of the present invention.

(First Embodiment)

FIG. 1 to FIG. 4 are block diagrams explaining a schematic configuration and an operation of a D/A converting device with an offset compensation function in a first embodiment of the present invention. FIG. 5 and FIG. 6 are views explaining the reason why a DC offset of a comparator itself can be canceled.

Figure 1:
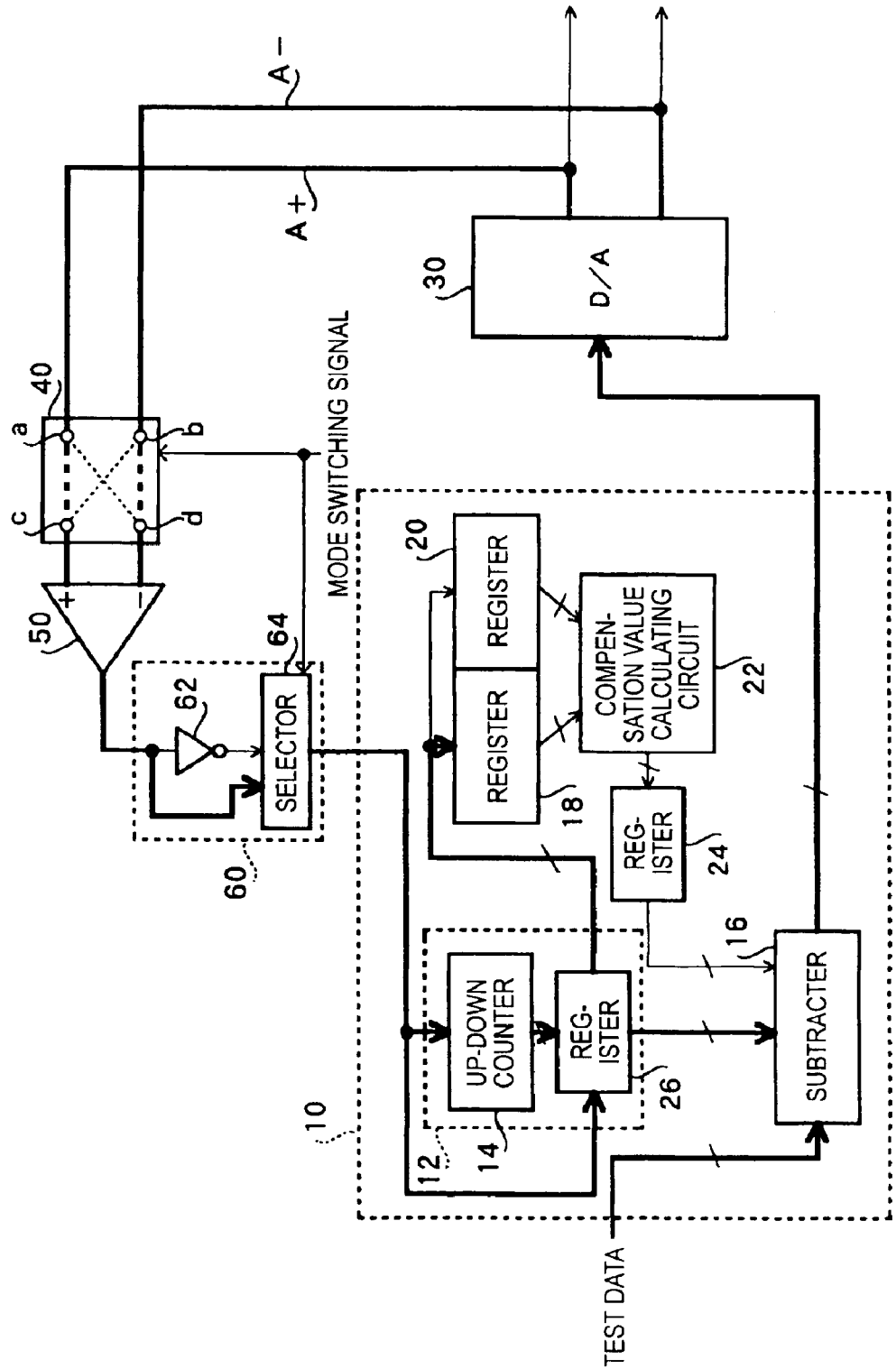
FIG. 1 is a view explaining a configuration (a D/A converter has a differential output configuration) and an operation (an operation of generating a first compensation value) of an example of a D/A converting device with an offset compensation function of the present invention.

A schematic configuration of the D/A converting device with the offset compensation function will be explained with reference to FIG. 1 hereunder. As shown in FIG. 1, the D/A converting device of the first embodiment includes an input data correcting portion 10, a D/A converter 30 having a differential output configuration, a comparator 50, an input changing switch 40 provided at the preceding stage of the comparator 50, and an polarity inverting circuit 60 (having an inverter 62 and a selector 64) for selectively inverting the polarity of an output signal of the comparator 50. The input changing switch 40 and the polarity inverting circuit 60 are controlled by a mode switching signal. In some case, a low-pass filter might be built in the D/A converter 30.

Also, the input data correcting portion 10 has a compensation value generating means 12 (substantially consisting of an up-down counter 14 and a register 26) employing the successive approximation method that changes the reference value 1 LSB (Least Significant Bit) by 1 LSB, two registers 18, 20 for storing temporarily a first compensation value and a second compensation value respectively, a compensation value calculating circuit 22, a register 24 for storing the result of compensation value calculation, and a subtracter 16 for subtracting the compensation value from the input data.

In this D/A converting device with the offset compensation function, with regard to the event that the comparator 50 itself has the DC offset, a total DC offset including the DC offset between differential outputs of the D/A converter 30 and the DC offset in the comparator 50 itself is corrected by the negative feedback control.

Figure 3:
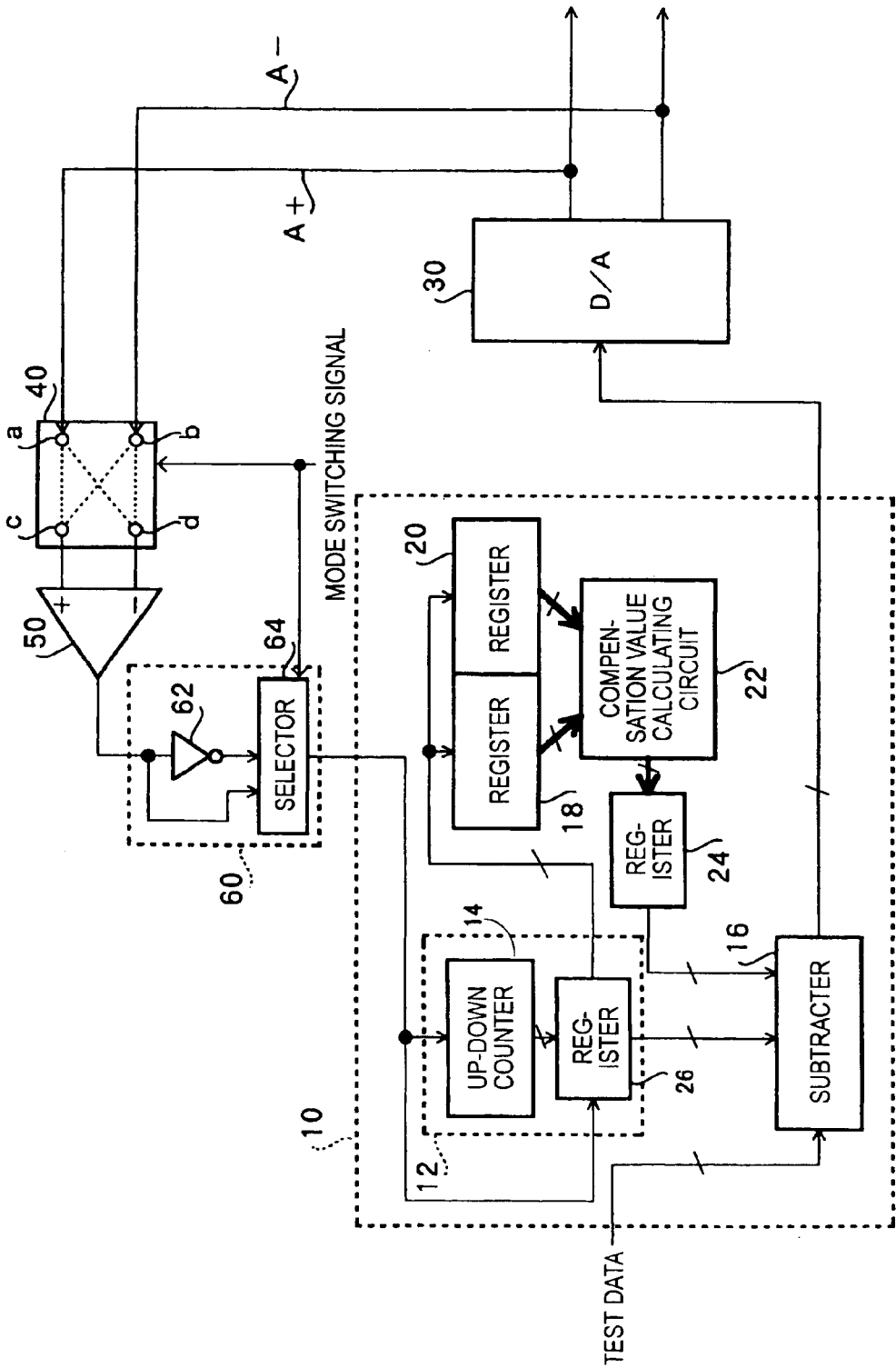
FIG. 3 is a view explaining an operation (an operation of generating a third compensation value) of an example of the D/A converting device with the offset compensation function of the present invention.
Figure 4:
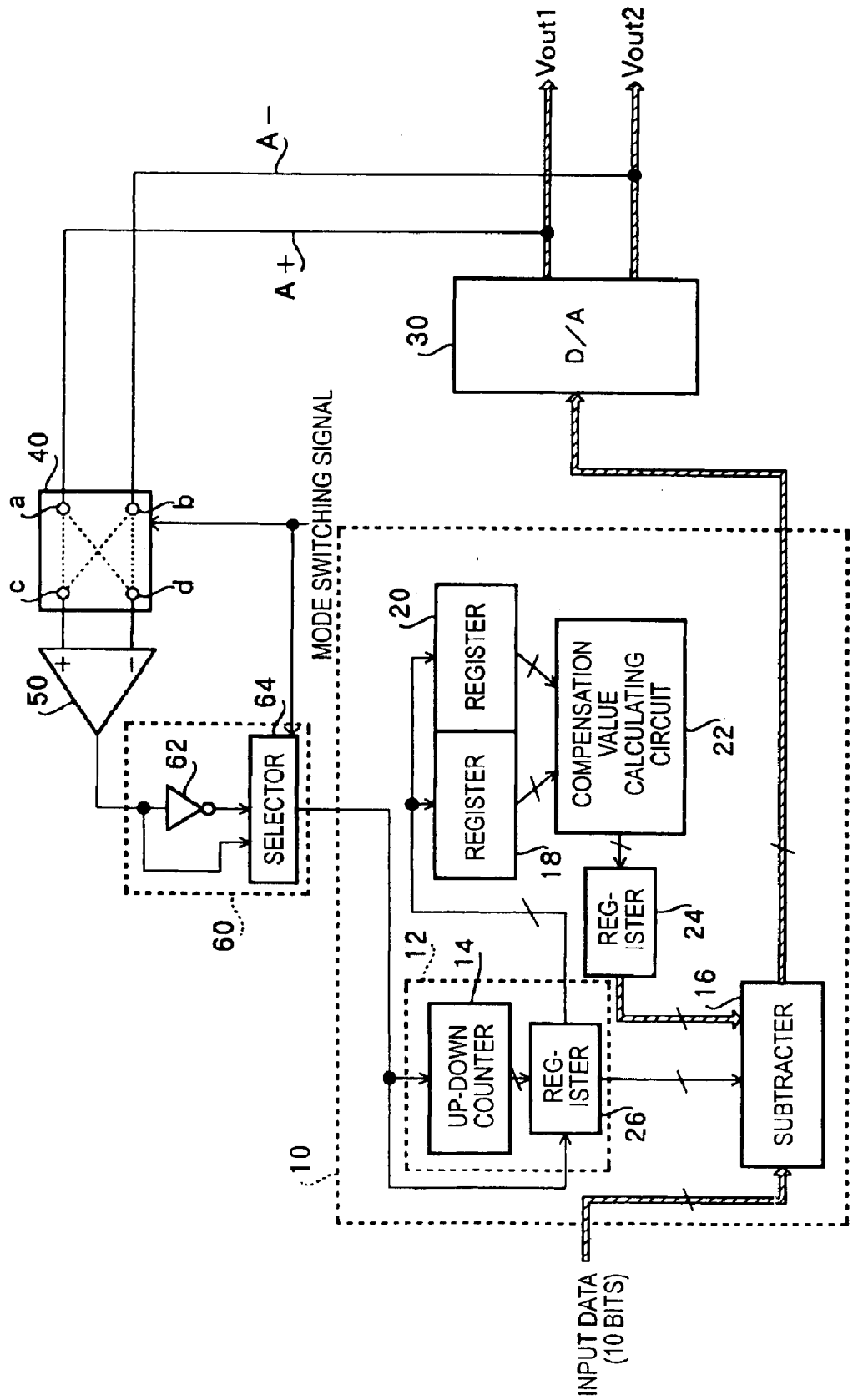
FIG. 4 is a view explaining a normal operation (an operation of executing D/A conversion while compensating a DC offset of the D/A converter by using the third compensation value) of the D/A converting device with the offset compensation function of the present invention.
Figure 5A:
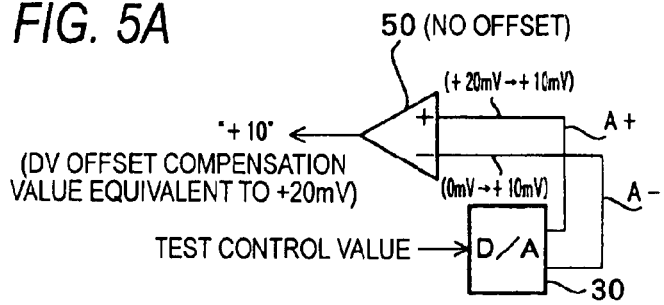
FIG. 5A and FIG. 5B are views showing a DC offset compensation value when no DC offset exists in a comparator in FIG. 4.
Figure 5B:
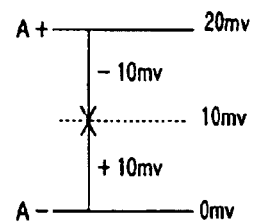

Next, an operation of compensating the DC offset will be explained hereunder. In a test mode that no signal to be transmitted to the radio path is present, this operation is roughly classified into a phase at which a first compensation value is calculated (FIG. 1), a phase at which a second compensation value is calculated (FIG. 2), and a phase at which a third compensation value is calculated (FIG. 3). Then, as shown in FIG. 4, the DC offset between the differential outputs of the D/A converter 30 can be removed by correcting the normal input data by using the third compensation value being calculated.

Then, explanation will be made concretely hereunder. In FIG. 1, operations (procedures) of calculating the first compensation value in the test mode are indicated with thick lines. First, the test data (for example, digital input data corresponding to an analog output 0 V (an almost intermediate value between VDD and VSS) of the D/A converter 30) are given to the input data correcting portion 10.

At first, since a count value of the compensation value generating means 12 is zero, the given test data are output from the subtracter 16 as they are and then given to the D/A converter 30 having the differential output configuration. Complementary outputs whose phases are mutually inverted are output from the D/A converter 30. These two output signals are represented as "A+", "A−" respectively. Assume that A+ is a non-inverting output with respect to the digital input data while A− is an inverting output with respect to the digital input data. Respective signals are input into the comparator 50 via the input changing switch 40.

As shown in FIG. 1, the input changing switch 40 has a function of connecting selectively input terminals "a", "b" to any one of output terminals "c", "d". In the input changing switch 40 in FIG. 1, the terminal "a" is connected to the terminal "c" and also the terminal "b" is connected to the terminal "d". This state is referred to as a first input mode. In this first input mode, the selector 64 in the polarity inverting circuit 60 passes the output signal of the comparator 50 as it is.

The output signal of the comparator 50 is given to the up-down counter 14 and the register 26, which functions as the compensation value generating means 12. The up-down counter 14 executes the up-counting operation when the output signal of the comparator 50 given at this time is at +1 (high level) while executing the down-counting operation when the output signal is at −1 (low level), and then stores the count value in the register 26. In contrast, the subtracter 16 subtracts the value of the register 26 (count value) from the test data, and then the output is input into the D/A converter 30 as the next digital input value. The similar operations are carried out subsequently along the loop. Such operations are continued until the polarity of the output signal of the comparator 50 is inverted.

In other words, the compensation value generating means 12, when detects polarity inversion of the output signal of the comparator 50, causes the register 18 to hold the count value at this time (this is the first compensation value) therein. In this case, the detection of the polarity inversion must be executed prudently while taking account of an infinitesimal fluctuation of the signal voltage.

Figure 2:
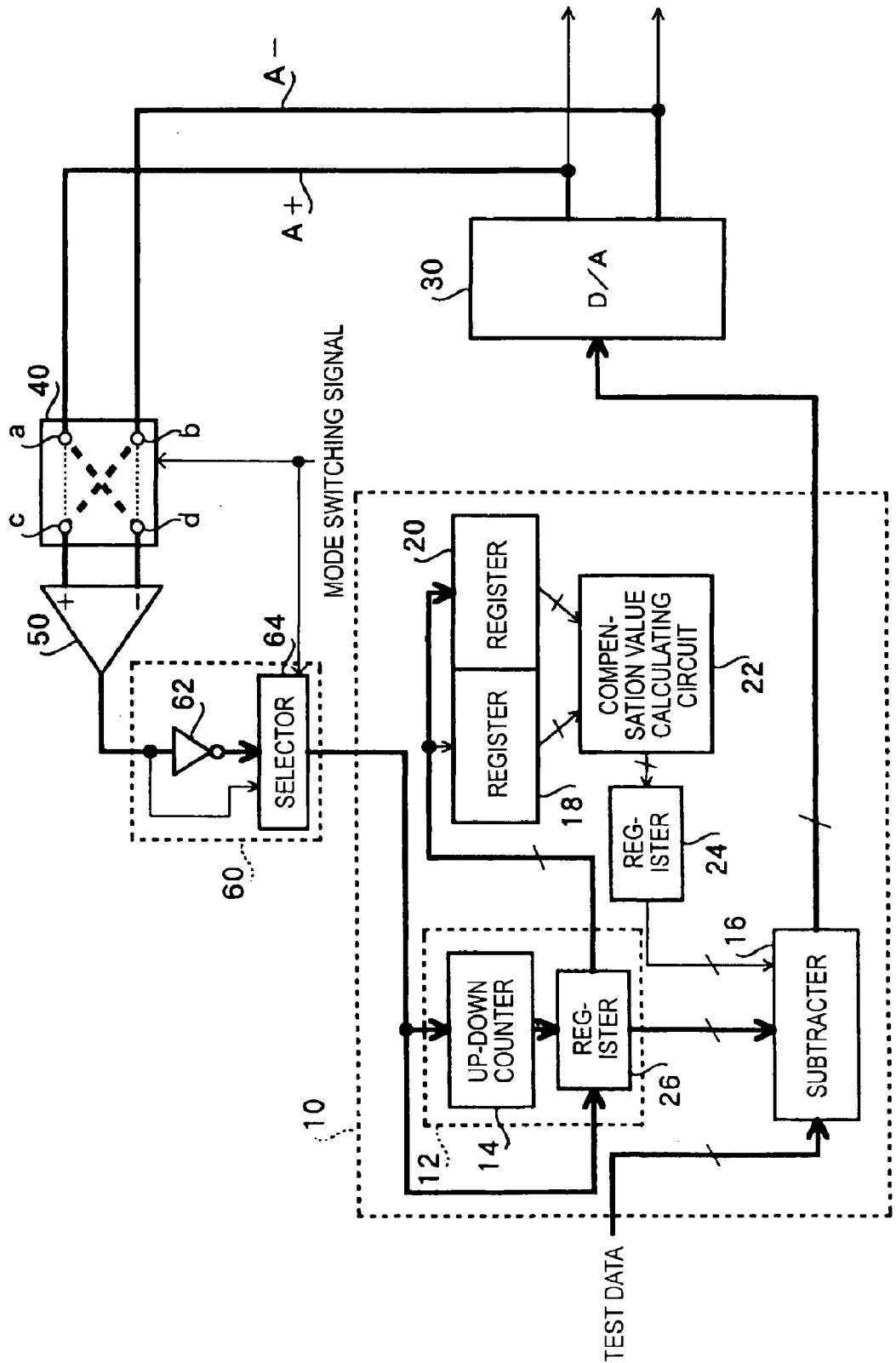
FIG. 2 is a view explaining an operation (an operation of generating a second compensation value) of an example of the D/A converting device with the offset compensation function of the present invention.

Next, as shown in FIG. 2, the input changing switch 40 is controlled to connect the terminal "a" to the terminal "d" and connect the terminal "b" to the terminal "c". This state is referred to as a second input mode. At this time, the selector 64 of the polarity inverting circuit 60 selects the output signal of the inverter 62. That is, the inverted signal of the output signal of the comparator 50 is given to the up-down counter 14 and the register 26.

In such situation, the count value of the compensation value generating means 12 is returned to zero, and then the similar operations to FIG. 1 are executed or an operation of calculating the second compensation value is executed continuously from the same count value as the first compensation value that is calculated by the operation in FIG. 1. The resultant second compensation value is stored in the register 20. Then, as shown in FIG. 3, the first and second compensation values are picked up from the register 18 and the register 20 respectively, and then the third compensation value is calculated by executing an average operation of the first and second compensation values in the compensation value calculating circuit 22 and then is stored in the register 24.

This third compensation value gives the compensation value obtained when the comparator 50 does not have the DC offset at all (that is, the compensation value that is generated based on the measured result obtained when the DC offset between the differential outputs of the D/A converter 30 is measured precisely and makes it possible to cancel the DC offset perfectly).

Therefore, as shown in FIG. 4, the normal input data are corrected by using the third compensation value being calculated, so that the DC offset between the differential outputs of the D/A converter 30 can be removed completely.

The reason why the offset of the comparator 50 is masked perfectly by the above method and disappears will be explained concretely with reference to FIGS. 5A to 5G and FIG. 6 hereunder. Here, assume that the minimum resolution (LSB) of the D/A converter 30 is set to 1 mV. In FIG. 5A, the case where the comparator 50 does not have the DC offset at all is assumed.

When the test data (testing control value: data that are equivalent to 0 V) are given to the D/A converter 30, the DC offset appears as the DC offset between the differential outputs if the D/A converter 30 has such DC offset, for the differential outputs A+, A− of the D/A converter 30 are independently provided mutually. Here, assume that a voltage of A+ out of the complementary outputs of the D/A converter 30 is 20 mV and a voltage of A− is 0 mV. In essence, two outputs ought to become 0 mV together. Consequently, the DC offset of 20 mV is generated between the differential outputs in this case.

Next, what compensation value is required (what level the compensation value should be set) to cancel the DC offset of 20 mV will be examined hereunder. Here, what is to be noted is such an aspect that, in the case of the differential output type D/A converter 30, A+ is corrected by −1 mV in response to the compensation value "+1" and conversely A− is corrected by 1 mV in response to the same value. That is, in the case of the differential output type D/A converter 30, a correction of −2 mV is applied in total between A+, A− in response to the compensation value "+1".

As described above, now the DC offset between the differential outputs of 20 mV is present between A+, A−. Therefore, in order to cancel this DC offset, as shown in FIG. 5B, a correction to subtract 10 mV from A+ (20 mV) and add 10 mV to A− (0 mV) may be applied (i.e., a 10 mV correction may be applied to A+, A− respectively). As a result, the necessary compensation value becomes "+10".

Figure 5C:
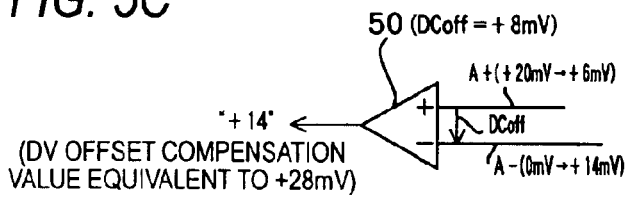
FIG. 5C and FIG. 5D are views showing a DC offset compensation value when a DC offset exists in the comparator before inputs are switched (at the time of non-crossing inputs)
Figure 5D:
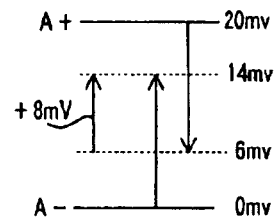
Figure 6:
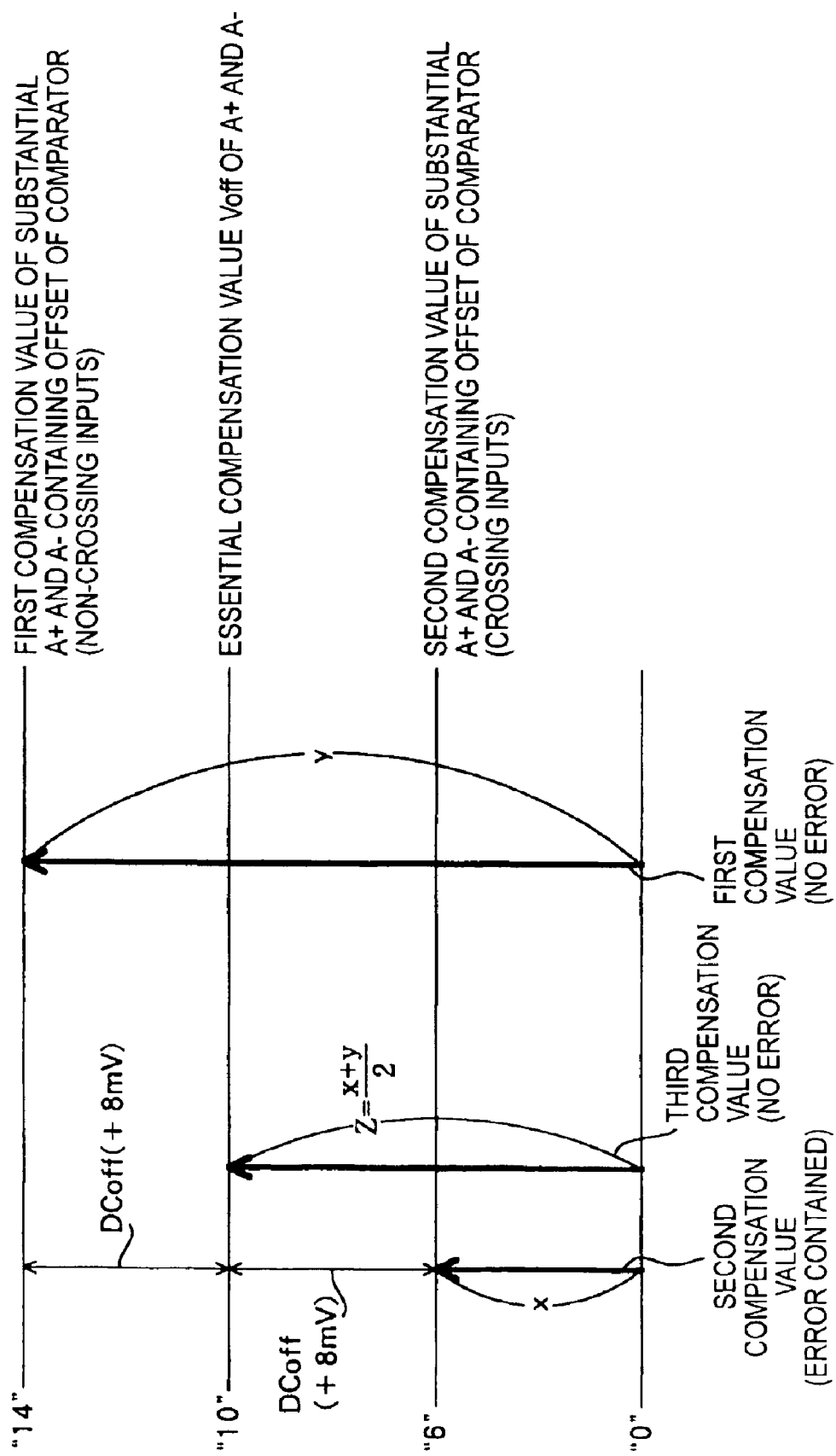
FIG. 6 is a view explaining the reason why the DC offset can be canceled in the D/A converting device with the offset compensation function of the present invention.

Here, as shown in FIG. 5C, the comparator 50 has the DC offset (Here, the DC offset is supposed such that substantially a voltage of the inverting terminal is 8 mV higher than a voltage of the non-inverting terminal). In this case, the DC offset 8 mV of the comparator 50 is added to the essential DC offset 20 mV between the differential outputs of the D/A converter 30, and thus the DC offset is expanded to 28 mV. In order to cancel the DC offset 28 mV, as shown in FIG. 5D, a correction to subtract 14 mV from A+(20 mV) and add 14 mV to A−(0 mV) may be applied. As a result, the necessary compensation value (first compensation value) becomes "+14".

Figure 5E:
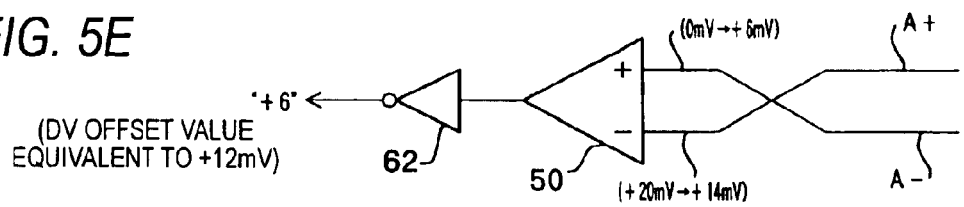
FIG. 5E and FIG. 5F are views showing a DC offset compensation value when the DC offset exists in the comparator after inputs are switched (at the time of crossing inputs)

Then, as shown in FIG. 5E, the input into the comparator 50 is switched. Then, A+ (this is set to +20 mV by the influence of the DC offset of the D/A converter 30) is input into the inverting terminal of the comparator 50. Also, A− (0 mV) is input into the non-inverting terminal of the comparator 50.

As a consequence, the DC offset 8 mV of the comparator 50 is subtracted from the essential DC offset 20 mV between the differential outputs of the D/A converter 30 to give 12 mV, and the error is reduced. However, since actually −12 mV(=−20 mV+8 mV) is applied as the input of the comparator 50, the polarity of the output of the comparator 50 becomes minus. Therefore, the polarity is inverted by the inverter 62 and the compensation value is calculated.

Figure 5F:
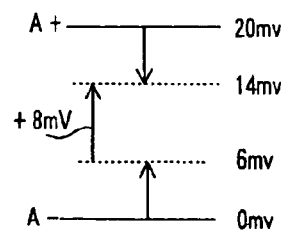
Figure 5G:
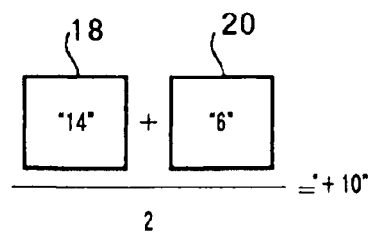
FIG. 5G is a view showing the event that a DC offset compensation value serving as a basis of the third compensation value is identical to the DC offset compensation value measured by the comparator that has no DC offset (case (a))

In order to cancel this DC offset 12 mV, as shown in FIG. 5F, a correction to subtract 6 mV from A+ (20 mV) and add 6 mV to A− (0 mV) may be executed. As a result, the compensation value (second compensation value) becomes "+6". Then, as shown in FIG. 5G, the third compensation value (="+10") is derived by taking an average of the first compensation value and the second compensation value. This value of the third compensation value coincides with the compensation value (="+10") obtained in FIG. 5A when the comparator 50 does not have the DC offset at all.

That is, the DC offset of the comparator 50 itself is masked and disappears. Therefore, the DC offset between the differential outputs of the D/A converter 30 is precisely measured, and thus the exact compensation value is derived based on this DC offset.

In other words, the compensation value of the DC offset between the differential outputs of the D/A converter 30 is "+10". Such a mode is employed that the compensation value (="+4") of the DC offset of the comparator 50 itself is added to this essential DC offset before the inputs into the comparator 50 are switched, while such a mode is employed that the compensation value (="+4") of the DC offset of the comparator 50 itself is subtracted after the inputs are switched. That is, the polarity of the DC offset of the comparator 50 itself is inverted before and after the inputs are switched.

On the contrary, the polarity of the essential DC offset (=+20 mV) between the differential outputs of the D/A converter 30 is identical before and after the inputs are switched. That is to say, the polarity of the output value is inverted after the inputs are switched but such inverted polarity is inverted by the inverter 62, so that the measured DC offset compensation value between the differential outputs still remains at "+10".

Accordingly, if the first compensation value (compensation value 1) and the second compensation value (compensation value 2) are added, the DC offset component of the comparator 50 is canceled whereas the essential DC offset component between the differential outputs of the D/A converter 30 is twice increased. Therefore, the compensation value corresponding only to the essential DC offset component between the differential outputs of the D/A converter 30 can be obtained by dividing such added DC offset component by 2.

A view showing the principle of the DC offset canceling comprehensively is FIG. 6. Assume that the compensation value of the essential DC offset between the differential outputs A+ and A− of the D/A converter 30 is Voff, this Voff is "+10 (equivalent to +20 mV)", as described above. Such a mode is taken that the DC offset DCoff (=+8 mV) of the comparator 50 is added before the inputs of the comparator 50 are switched (at the time of non-crossing inputs). Assume that the first compensation value (compensation value 1) is "y", the "y" becomes "+14". In contrast, such a mode is taken that the DC offset DCoff (=+8 mV) of the comparator 50 is subtracted after the inputs of the comparator 50 are switched (at the time of crossing inputs). Assume that the second compensation value is "x", the "x" becomes "+6". Now, x+y=2Voff.

Therefore, (x+y)/2=Voff=z is derived. This third compensation value "z" gives the compensation value that corresponds to the essential DC offset between the differential outputs.

In the first embodiment, when connections between the inverting terminal, the non-inverting terminal of the comparator 50 and the terminals "c", "d" of the input changing switch 40 are reversed, the output of the comparator 50 is reversed completely in contrast to the first embodiment, and thus the operation of the up-down counter 14 is also reversed in contrast to the first embodiment. Therefore, the polarity of the resultant compensation value here is inverted. Accordingly, the correction to add the compensation value to the test data is required.

Similarly, the first, second, and third compensation values have equal values to respective compensation values in the first embodiment, but their polarities are inverted. As a result, if the correction to add the third compensation value to the normal input data is applied, the DC offset between the differential outputs of the D/A converter 30 can be removed perfectly.

Also, in the first embodiment, in the case where the first compensation value is calculated based on the inverted signal of the output signal of the comparator 50 in the first input mode and also the second compensation value is calculated based on the output signal of the comparator 50 in the second input mode, similarly the compensation values in respective input modes, i.e., the first compensation value, the second compensation value, and the third compensation value, are equal in magnitude but opposite in polarity to respective compensation values in the first embodiment. Therefore, in this case, the DC offset between the differential outputs of the D/A converter 30 can be removed perfectly, like the first embodiment, by employing the adder in place of the subtracter.

(Second Embodiment)

Figure 7:
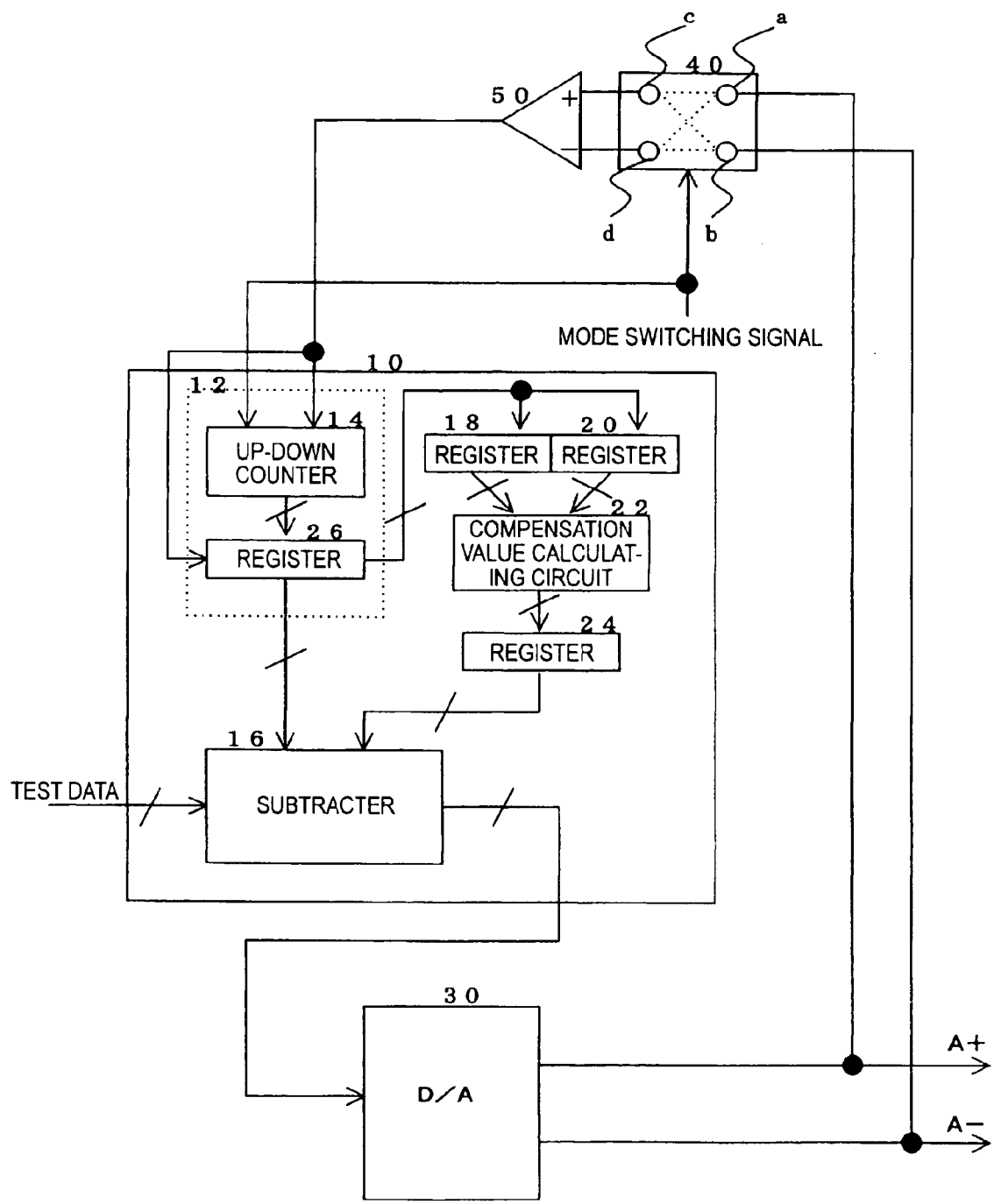
FIG. 7 is a block diagram showing the D/A converting device with the offset compensation function of the first embodiment, a part of the configuration of which is varied without change of the function.

FIG. 7 is a block diagram showing the D/A converting device with the offset compensation function in the first embodiment of the present invention shown in FIG. 1 to FIG. 4, the function of which is not changed but a part of the configuration of which is varied.

In the second embodiment, instead of removal of the polarity inverting circuit 60 (including the inverter 62 and the selector 64) to selectively invert the polarity of the comparator 50, the counting operation of the up-down counter 14 may be reversed by the mode switching signal in the first input mode and the second input mode respectively.

More particularly, in the first input mode, the up-down counter 14 executes the up-counting operation when the output of the comparator is at +1 (high level) and executes the down-counting operation when the output of the comparator is at −1 (low level). Conversely, in second input mode, the up-down counter 14 executes the down-counting operation when the output of the comparator is at +1 (high level) and executes the up-counting operation when the output of the comparator is at −1 (low level). Since the outputs of the up-down counter 14 are identical to those in the first embodiment in both modes after this variation is applied, the function and the operation of the D/A converting device with the offset compensation function do not change at all.

(Third Embodiment)

Figure 8:
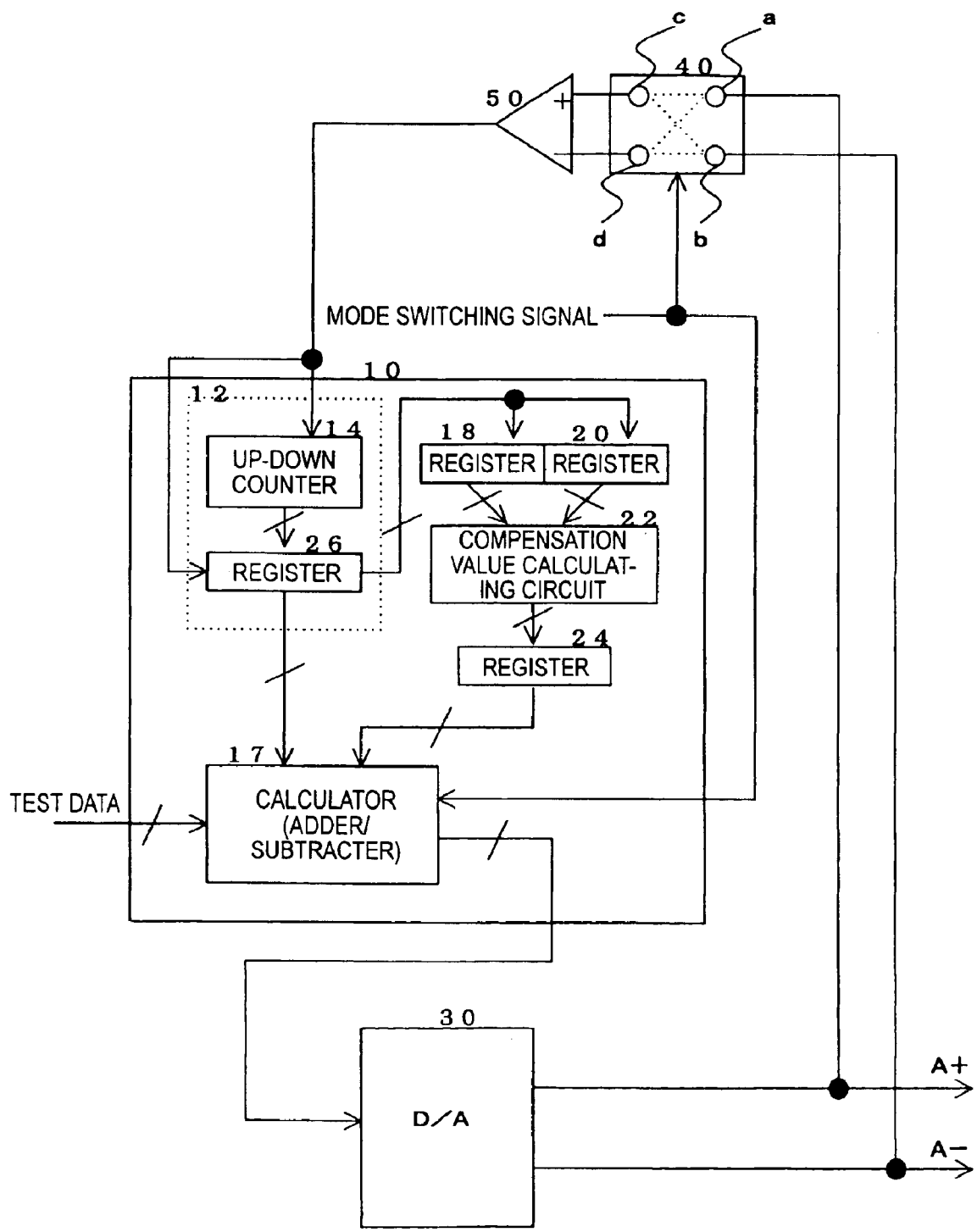
FIG. 8 is another block diagram showing the D/A converting device with the offset compensation function of the first embodiment, a part of the configuration of which is varied without change of the function.

FIG. 8 is another block diagram showing the D/A converting device with the offset compensation function in the first embodiment of the present invention, the function of which is not changed but a part of the configuration of which is varied.

In the third embodiment, instead of removal of the polarity inverting circuit 60 (including the inverter 62 and the selector 64) to invert selectively the polarity of the comparator 50, the subtracter 16 is replaced with a calculator (adder/subtracter) 17 and then an operation of the calculator 17 for calculating the compensation value for the input data is switched by the mode switching signal such that such calculator 17 acts as the subtracter in the first input mode, and conversely such calculator 17 acts as the adder in the second input mode.

According to this variation, the second compensation value calculated in the second input mode is equal in magnitude but opposite in polarity to the second compensation value in the first embodiment. Therefore, if the third compensation value is calculated by subtracting the second compensation value from the first compensation value and then dividing the resultant value by 2 and in addition an amount of the third compensation value calculated as above is subtracted from the normal input data, the DC offset between the differential outputs of the D/A converter 30 can be removed perfectly.

Similarly, if the third compensation value is calculated by subtracting the first compensation value from the second compensation value and dividing the resultant value by 2 and in addition an amount of the third compensation value calculated as above is added to the normal input data, the DC offset between the differential outputs of the D/A converter 30 can be removed perfectly.

In the third embodiment, in the case where the connections between the input terminals of the comparator 50 and the input changing switch 40 is reversed or in the case the inverted signal of the output signal of the comparator 50 is input into the compensation value generating means 12, the operation of the calculator 17 is reversed from the third embodiment and also the first compensation value, the second compensation value, and the third compensation value have the same values but their polarities are inverted.

(Fourth Embodiment)

Figure 9:
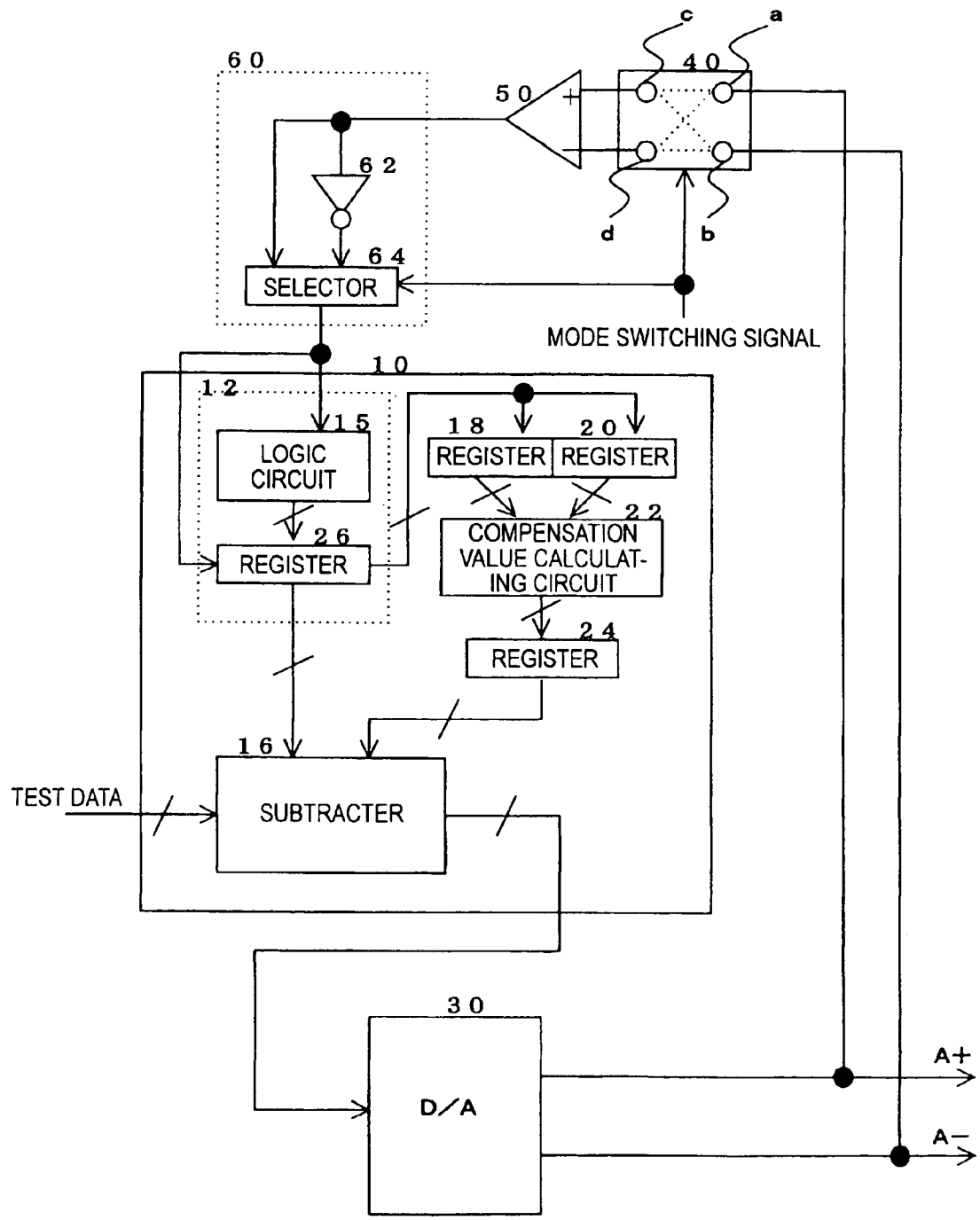
FIG. 9 is a view explaining a configuration of an example of the D/A converting device with the offset compensation function of the present invention using a binary search method.

FIG. 9 is a block diagram explaining a configuration of the D/A converting device with the offset compensation function using the binary search method to calculate the first and second compensation values in the first and second input modes, in the first embodiment of the present invention shown in FIG. 1 to FIG. 4.

In the forth embodiment, the binary search method is employed in place of the successive approximation method in which the reference value is changed every 1 LSB by using the up-down counter employed in the first embodiment shown FIG. 1 to FIG. 4.

Figure 10:
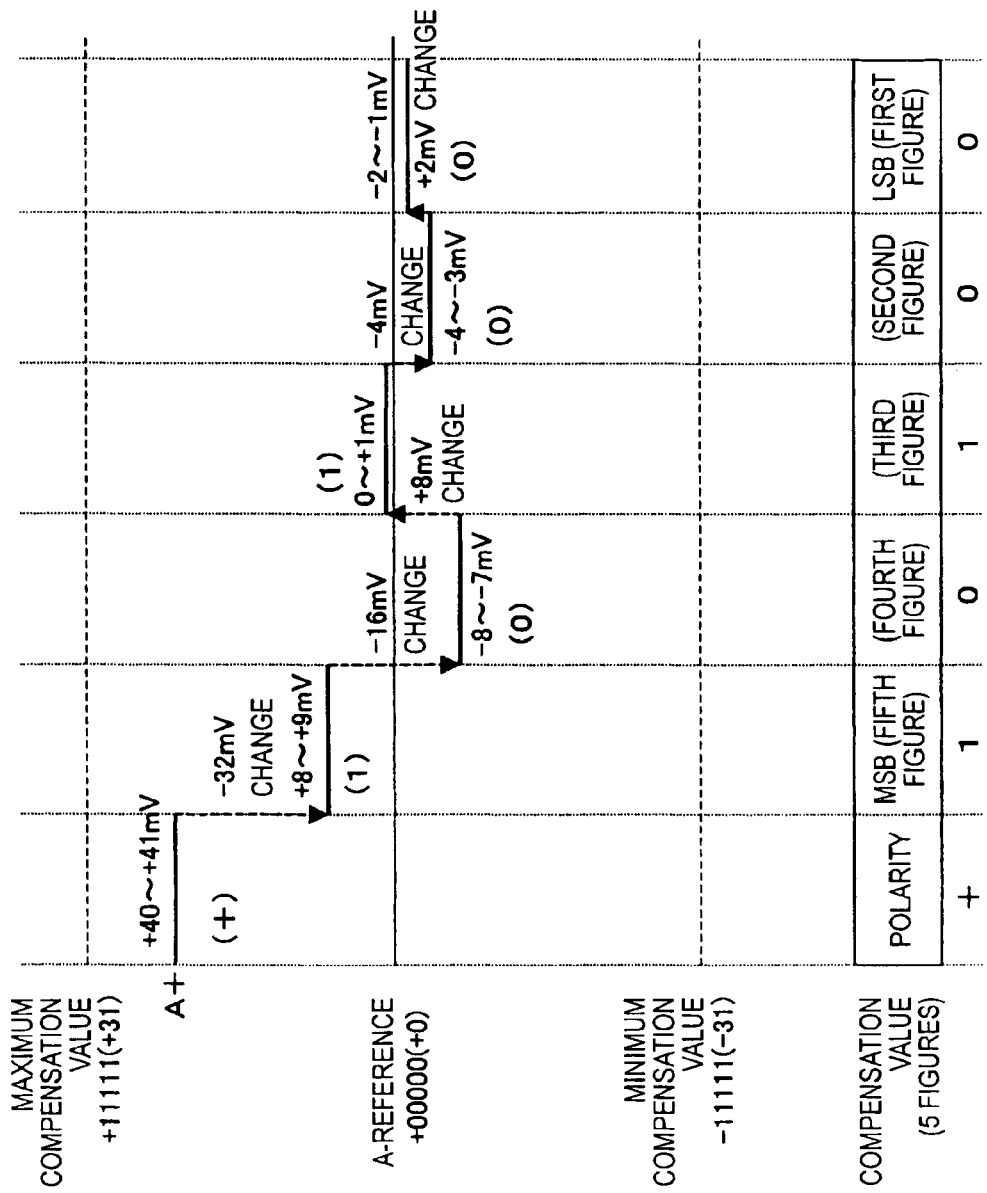
FIG. 10 is a view explaining an operation of the D/A converting device with the offset compensation function of the present invention using the binary search method.

FIG. 10 shows concrete procedures of calculating the compensation value by using the binary search method. As explained as above, assume that 1 LSB of the D/A converter 30 is 1 mV. Then, in the case of the differential output type D/A converter 30, a correction of −2 mv is applied in total between A+ and A− in response to the compensation value "+1".

Suppose that the DC offset between the differential outputs A+ and A− is +40 mV to +41 mV, then the comparator has no DC offset, and then the number of figures of the compensation value is 5 figures. Then, since the output of the comparator 50 is input into a logic circuit 15 in the first input mode, the first output of the comparator 50 becomes +1 because A+ is larger than A−. This indicates that the polarity of the compensation value is "plus", and "+10000" is output to the register 26 from the logic circuit 15.

Then, "+16" ("+10000") is subtracted from the test data by the subtracter 16, and a voltage difference between A+ and A− becomes +8 mV to +9 mV. The output of the comparator 50 still remains at +1, and accordingly the fifth figure of the compensation value is "1" and "+11000" is output to the register 26 from the logic circuit 15.

Then, "+24" ("+11000") is subtracted from the test data by the subtracter 16, and a voltage difference between A+ and A− becomes −8 mV to −7 mV. In this case, since the output of the comparator 50 becomes "−1", the fourth figure of the compensation value is "0" and "+10100" is output to the register 26 from the logic circuit 15.

Then, "+20" ("+10100") is subtracted from the test data by the subtracter 16, and a voltage difference between A+ and A− becomes 0 mV to +1 mV. In this case, since the output of the comparator 50 becomes "+1", the third figure of the compensation value is "1" and "+10110" is output to the register 26 from the logic circuit 15.

Then, "+22" ("+10110") is subtracted from the test data by the subtracter 16, and a voltage difference between A+ and A− becomes −4 mV to −3 mV. In this case, since the output of the comparator 50 becomes "−1", the second figure of the compensation value is "0" and "+10101" is output to the register 26 from the logic circuit 15.

Then, "+21" ("+10101") is subtracted from the test data by the subtracter 16, and a voltage difference between A+ and A− becomes −2 mV to −1 mV. In this case, since the output of the comparator 50 becomes "−1", the first figure of the compensation value is "0". That is, the first compensation value is "+10100".

If the figure of LSB of the first compensation value calculated by the binary search method is "0", the DC offset compensation precision of the D/A converter 30 is "0 mV to −2 mV". Therefore, the DC offset compensation precision of the D/A converter 30 becomes "±1 mV" by adding "+½" to the first compensation value.

Also, if the figure of LSB of the first compensation value is "1", the DC offset compensation precision of the D/A converter 30 is "0 mV to +2 mV". Therefore, the DC offset compensation precision of the D/A converter 30 becomes "±1 mV" by adding "−½" to the first compensation value.

Therefore, the case where the figure of LSB of the first compensation value calculated by the binary search method is "0" and the figure of LSB of the first compensation value is "1" are considered together, the DC offset compensation precision of the D/A converter 30 can be improved from "4 mv error at maximum" to "2 mV error at maximum" by performing a correction of "+½" or "−½" to the first compensation value, as described above.

Also, in the successive approximation method shown in FIG. 10, etc., the measurement must be executed twenty two times. If the binary search method is employed, the compensation value is decided by executing the measurement six times from MSB (Most Significant Bit) to LSB and therefore a measuring time can be shortened. In the second input mode, the second compensation value can also be calculated by the similar procedures. Also, procedures except the procedures of calculating the first and second compensation values are totally identical to those in the first embodiment.

(Fifth Embodiment)

Figure 11:
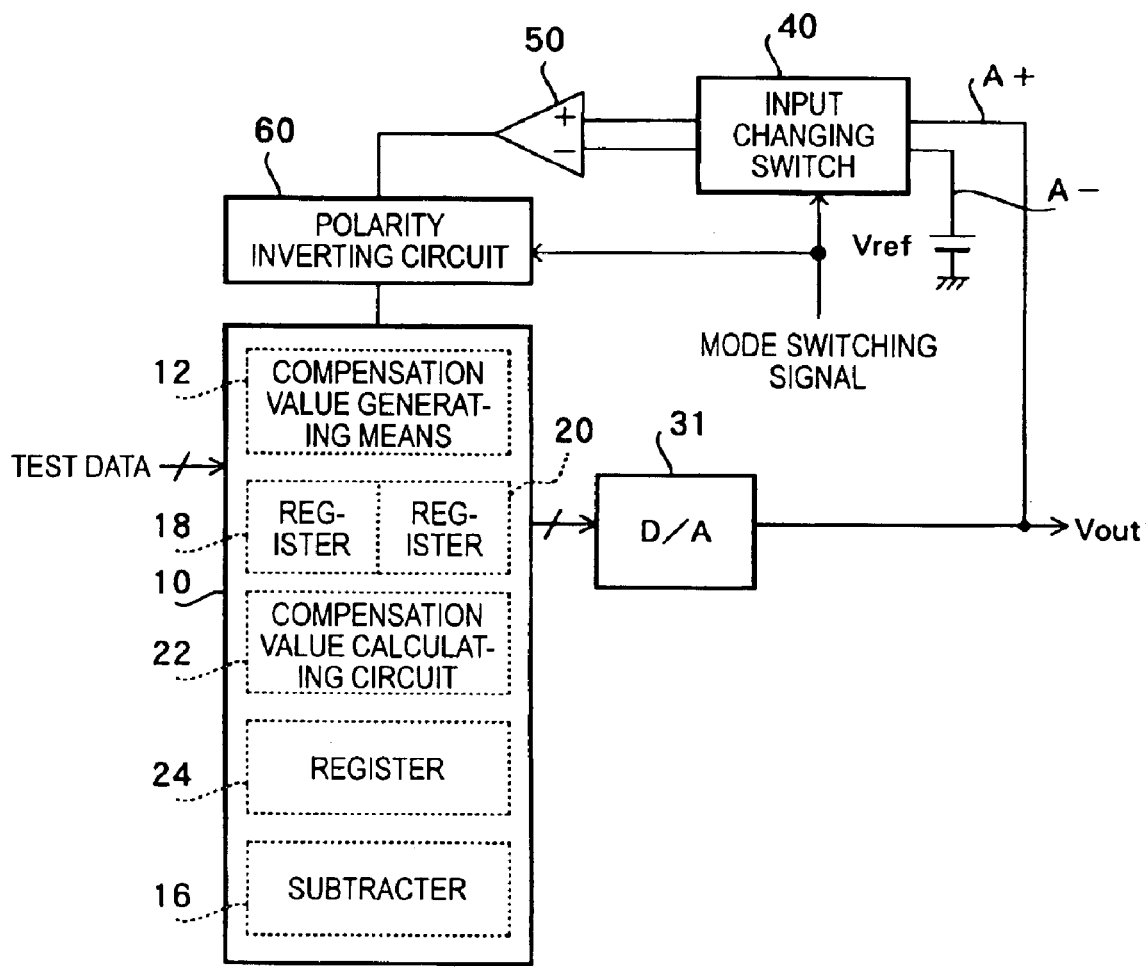
FIG. 11 is a view explaining a configuration of another example (a D/A converter has a single output configuration) of the D/A converter with the offset compensation function of the present invention.

FIG. 11 shows an example in which the present invention is applied to the offset compensation of a single output type D/A converter 31. One input (A+) of the input changing switch 40 is an output signal of the D/A converter 31, and the other input (A−) is a reference voltage (equivalent to an output voltage of the ideal D/A converter). Remaining configurations are identical to those mentioned above. In FIG. 11, the same reference numerals and signs are affixed to the same portions as those in the above example.

Distinguishing operations are shown in FIGS. 12A to 12D. These operations are similar in principle to the operations explained with reference to FIGS. 5A to 5G. Assume that the minimum resolution (LSB) of the D/A converter 31 is also set to 1 mV herein. In the case of the single output type D/A converter 31, a correction of −1 mV is applied to A+ only in response to the compensation value "+1". That is, the compensation value of the single output type D/A converting device is twice that of the differential output type D/A converting device.

Figure 12A:
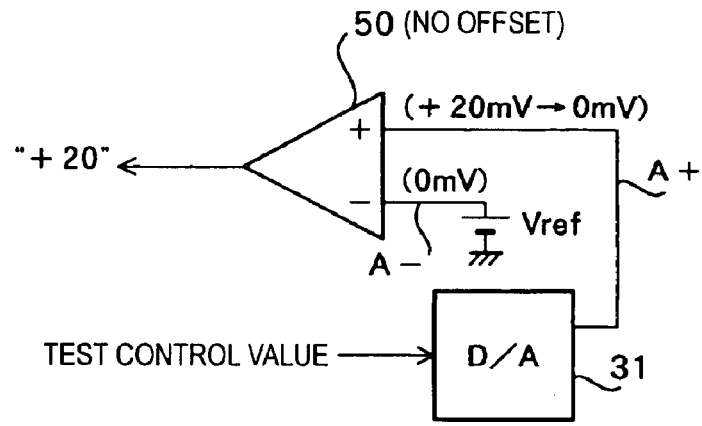
FIG. 12A is a view showing a DC offset compensation value when no DC offset exists in a comparator in FIG. 11.
Figure 12B:
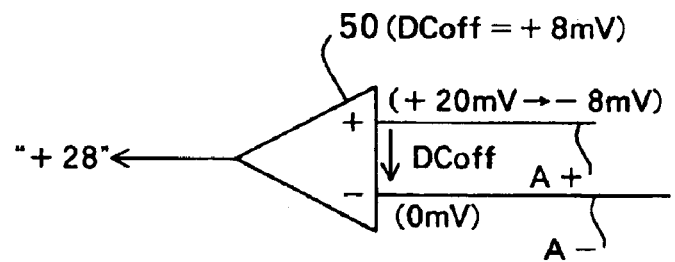
FIG. 12B is a view showing a DC offset compensation value when a DC offset exists in the comparator before inputs are switched (at the time of non-crossing inputs)
Figure 12C:
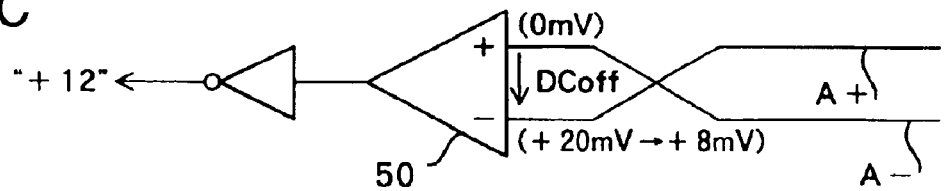
FIG. 12C is a view showing a DC offset compensation value when the DC offset exists in the comparator after inputs are switched (at the time of crossing inputs)
Figure 12D:
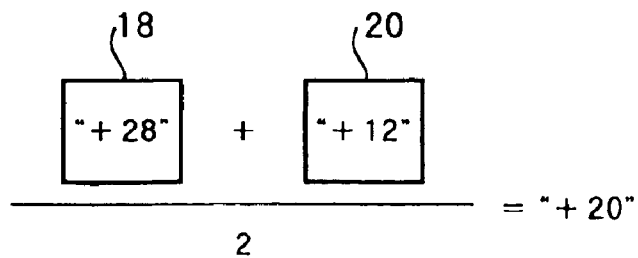
FIG. 12D is a view showing the event that a DC offset compensation value serving as a basis of a mean compensation value is identical to the DC offset compensation value measured by the comparator that has no DC offset (case (a))

That is, FIG. 12A shows the compensation value of the DC offset of the D/A converter 31 when no DC offset exists in the comparator 50. FIG. 12B shows the compensation value of the DC offset (corresponding to the first compensation value) of the D/A converter 31 when the DC offset exists in the comparator 50 before the inputs are switched. FIG. 12C shows the compensation value of the DC offset (corresponding to the second compensation value) of the D/A converter 31 when the DC offset exists in the comparator 50 after the inputs are switched. FIG. 12D shows the event that the third compensation value obtained by averaging the first and second compensation values coincides with the compensation value in FIG. 12A. In this case, the reference voltage used herein is not always set to the voltage equivalent to the output of the ideal D/A converter, and a constant voltage value may be used as the reference voltage.

Also, as explained in the first embodiment, in this fifth embodiment, it is possible similarly to employ the configuration in which the connection between the input terminal of the comparator 50 and the input changing switch 40 is reversed, and the configuration in which the first compensation value is calculated based on the inverted signal of the output signal of the comparator 50 in the first input mode and also the second compensation value is calculated based on the output signal of the comparator 50 in the second input mode.

Also, as explained in the second and third embodiments, in this fifth embodiment, it is possible similarly to employ the configuration in which, instead of the removal of the polarity inverting circuit 60 to selectively invert the polarity of the output signal of the comparator 50, the counting operation of the up-down counter 14 is reversely switched by the mode switching signal in the first input mode and the second input mode.

Also, it is possible to employ the configuration in which, instead of the removal of the polarity inverting circuit 60 to selectively invert the polarity of the output signal of the comparator 50, the subtracter 16 is replaced with the calculator 17 and also the operation of the calculator 17 to calculate the compensation value for the input data is switched by the mode switching signal such that such calculator 17 serves as the subtracter in the first input mode, while such calculator 17 serves as the adder in the second input mode.

(Sixth Embodiment)

Figure 13:
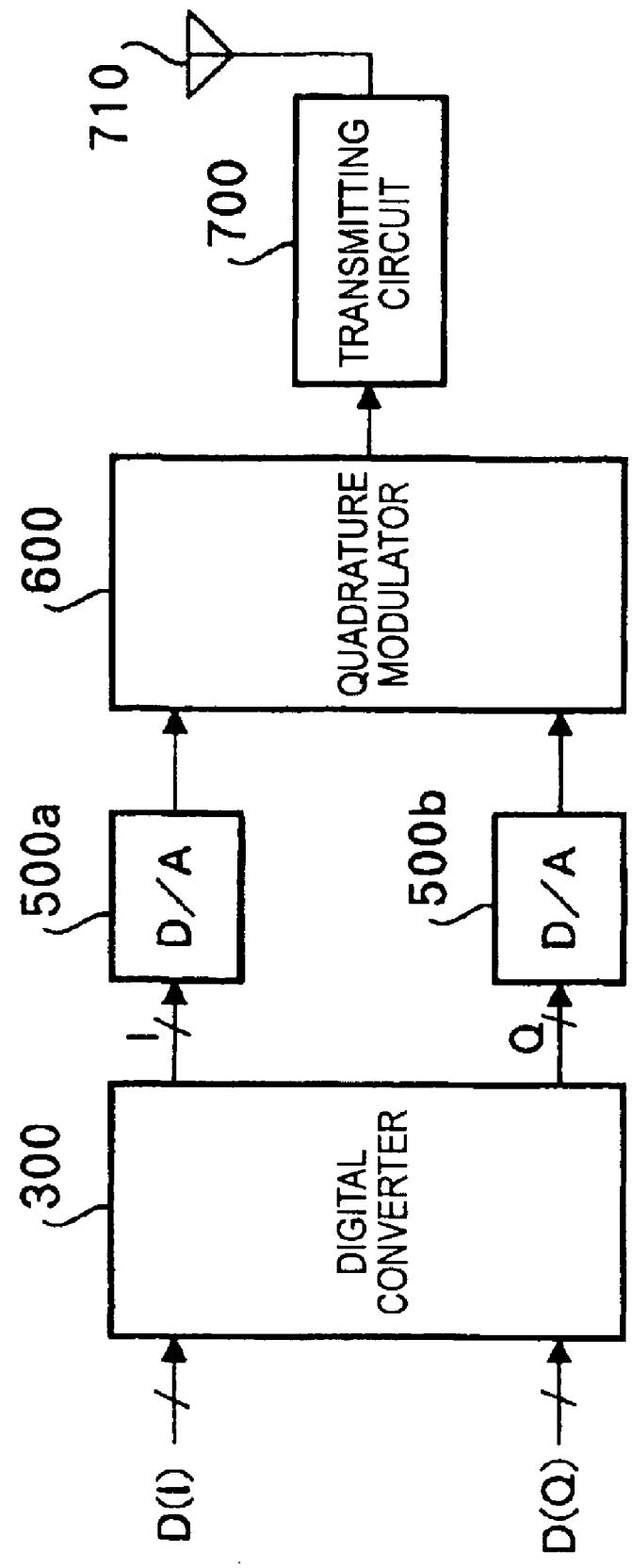
FIG. 13 is a block diagram showing a configuration of a digital radio transmitter into which the D/A converter with the offset compensation function (packaged as LSI) of the present invention is installed.

FIG. 13 is a block diagram showing a schematic configuration of a digital radio transmitter that employs the D/A converting device with the offset compensation function of the present invention.

As shown in FIG. 13, this digital radio transmitter has a digital converter 300, D/A converting devices 500a, 500b corresponding to I, Q respectively (which are the D/A converting device with the offset compensation function of the present invention), a quadrature modulator 600, a transmitting circuit 700, and an antenna 710. The digital converter 300 is composed of a diffusion modulator, for example. Also, the quadrature modulator 600 is composed of a QPSK (Quad Phase Shift Keying) modulator, for example. The digital converter 300, the D/A converting devices 500a, 500b, the quadrature modulator 600, and the transmitting circuit 700 are integrated in one LSI respectively.

According to the sixth embodiment, since the DC offset is canceled, input/output characteristics of two D/A converting devices 500a, 500b coincide with each other and thus respective I, Q transmission signals coincide in phase with each other, which makes the precise transmission possible.

(Seventh Embodiment)

Figure 14:
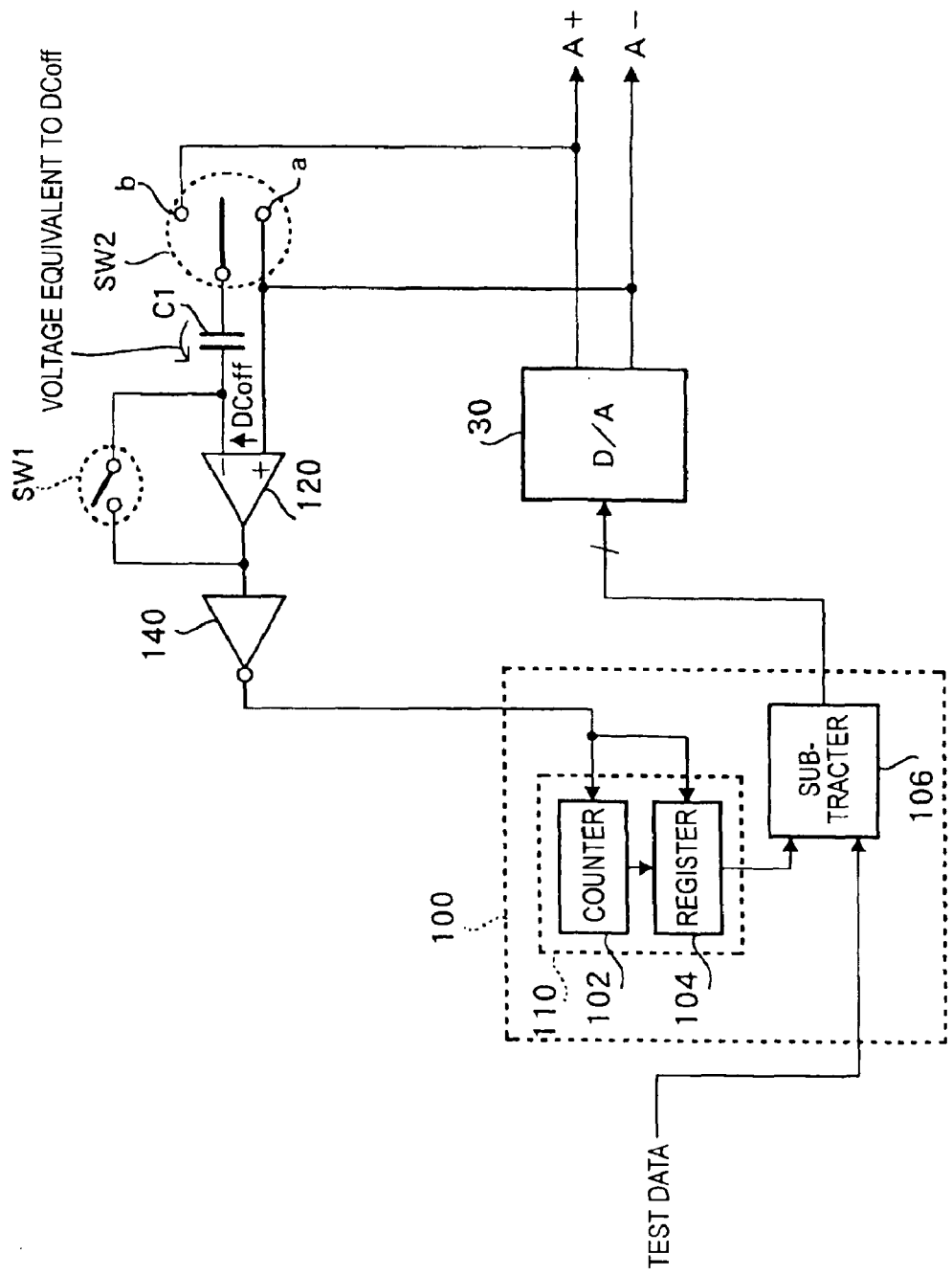
FIG. 14 is a view showing an overall configuration of an example of a D/A converting device with an offset compensation function of the present invention, in which the offset compensation function is given to the comparator itself.

FIG. 14 is a block diagram showing an example of a configuration of a D/A converting device with an offset compensation function, in which an OP amplifier and an inverter are employed in place of the comparator and also an offset canceling function is given to the comparator itself (i.e., which employs a self-compensation type OP amplifier).

In the seventh embodiment, the DC offset contained in the OP amplifier is canceled by the analog approach using the capacitor, and then the DC offset between the differential outputs of the D/A converter is executed based on the input data compensation.

In the first to sixth embodiments, the overall system looks like such a situation that the DC offset of the OP amplifier is removed. In contrast, the present embodiment is different from the above embodiments in that the OP amplifier itself has the offset canceling function and thus the self-compensation type OP amplifier is employed.

However, it is common to all embodiments that the DC offset of the OP amplifier itself is canceled by utilizing information about the DC offset contained in the OP amplifier.

First, an overall configuration of the D/A converting device in FIG. 14 will be explained hereunder.

As shown in FIG. 14, an input data correcting portion 100 includes a compensation value generating means 110 (having a counter 102 and a register 104), and a subtracter 106.

Like the above embodiments, a count value of the counter 102 is used via the register 104 as a compensation value as it is.

The register 104 also acts to store the counter value when the polarity of the output signal of an OP amplifier 120 is inverted.

Also, in the present embodiment, the complementary output type (differential output type) D/A converter 30 is used.

Also, a first switch SW1 for switching connection/disconnection between an output terminal and an inverting input terminal of the OP amplifier 120 with the offset canceling function and a capacitor C1, one end of which is connected to the inverting input terminal of the OP amplifier 120 and the other end of which is connected to a second switch SW2, are provided.

The second switch SW2 is provided to feed selectively either a voltage of an output A+ as one output of the D/A converter 30 on its terminal "b" side or a voltage of an output A− as the other output thereof on its terminal "a" side to the other end of the capacitor C1.

A non-inverting input terminal of the OP amplifier 120 is connected to the terminal "a", and the output terminal of the OP amplifier 120 is connected to an input terminal of an inverter 140. An output terminal of the inverter 140 is connected to the counter 102 and the register 104.

In the present embodiment, a contact of the second switch SW2 is switched to the terminal a side, and also the OP amplifier 120 is constructed as a voltage follower by switching on the first switch SW1. Accordingly, a voltage equivalent to the DC offset of the OP amplifier 120 is generated across the capacitor C1.

Then, the OP amplifier 120 is restored to the comparator configuration by switching off the first switch SW1. Then, the contact of the second switch SW2 is also switched to the terminal "b" side. At this time, the DC offset between the differential outputs is generated between A+ and A− in the test mode. Therefore, a voltage derived by adding the voltage equivalent to the DC offset of the OP amplifier 120 to the DC offset between the differential outputs of the D/A converter 30 is applied between input terminals of the OP amplifier 120.

This signifies that the voltage being input into the inverting terminal of the OP amplifier 120 is corrected by an amount of the DC offset of the OP amplifier 120.

Therefore, the DC offset of the OP amplifier 120 is canceled. As a result, the DC offset between the differential outputs of the D/A converter 30 can be measured precisely.

Next, explanation will be made concretely hereunder. When test data are input into the circuit in FIG. 14, an analog voltage corresponding to the test data is generated between the outputs A+ and A− of the D/A converter 30.

Figure 15:
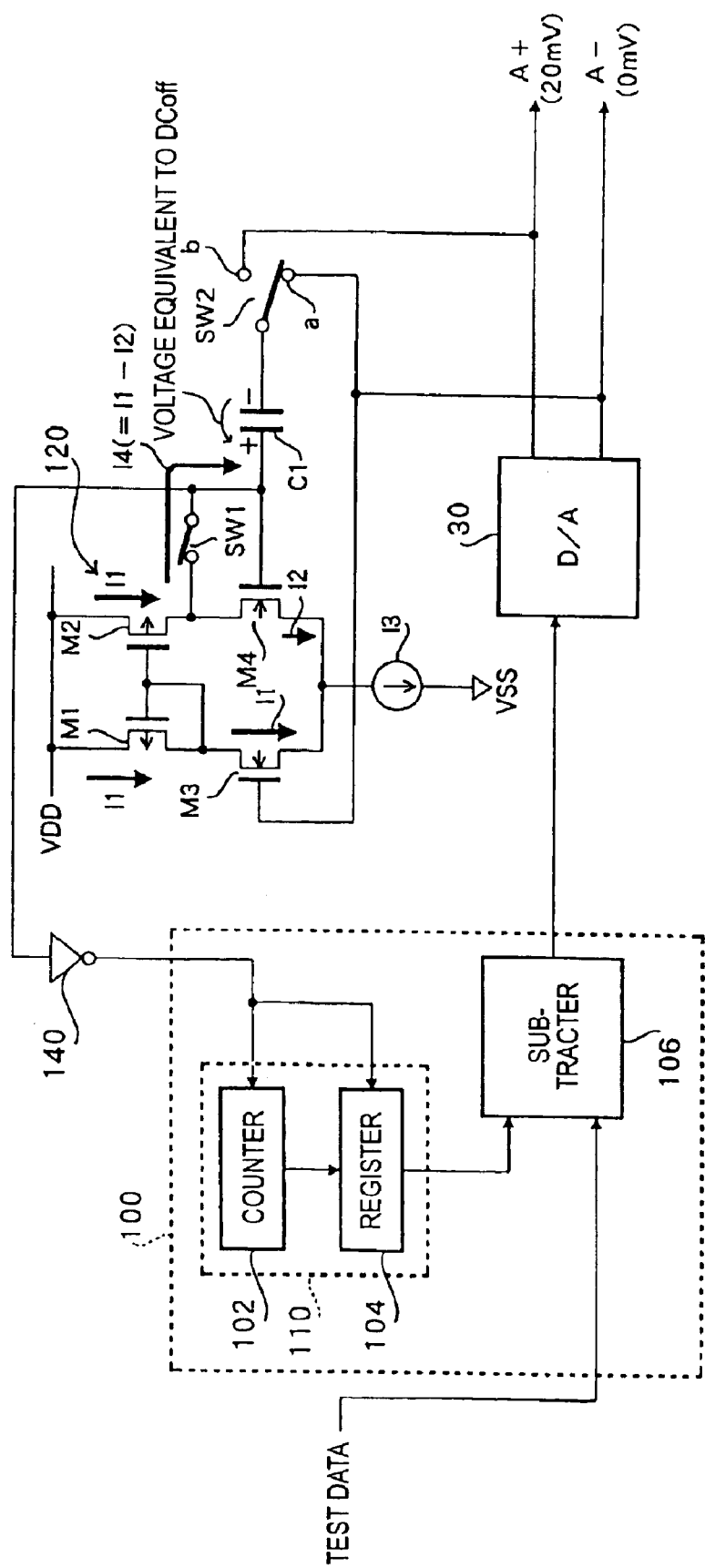
FIG. 15 is a circuit diagram explaining a particular configuration and operation (operation of generating a voltage equivalent to the DC offset of the comparator across a capacitor) of an example of the D/A converting device with the offset compensation function of the present invention, in which the offset compensation function is given to the comparator itself.

FIG. 15 is a view explaining concretely an operation of generating a voltage, which is equivalent to the DC offset of the OP amplifier 120, across the capacitor C1.

As shown in FIG. 15, the OP amplifier 120 has NMOS transistors M3, M4 constituting a differential pair, current mirror loads M1, M2, and a constant-current source 13.

In FIG. 15, since the first switch SW1 is on-state, the OP amplifier 120 is constructed as a voltage follower. Also, the second switch SW2 is switched into the terminal "a" side.

Also, the voltage of A− as one output of the D/A converter 30 is given to a gate of the NMOS transistor M3 and the terminal "a" of the switch SW2connected to the capacitor C1.

Since the OP amplifier 120 is constructed as a voltage follower, all voltages of the inverting terminal (gate of the NMOS transistor M4), the non-inverting terminal (gate of the NMOS transistor M3), and the output terminal (connection point between a drain of the NMOS transistor M4 and a drain of the PMOS transistorM2 which constitutes the current mirror load) should in theory become to "potential of A−" and coincide mutually.

However, because in fact the DC offset exists in the OP amplifier 120, gate potentials of the NMOS transistors (M3, M4) constituting the differential pair do not coincide with each other.

In FIG. 15, assume that a driving ability of the NMOS transistor M3 is larger than a driving ability of the NMOS transistor M4. That is, assume that a channel conductance (W/L) of the NMOS transistor M3 is larger than a channel conductance of the NMOS transistor M4.

In principle, a current obtained by dividing equally a current I3 of the constant-current source flows through left/right circuits of the differential pair respectively. However, if there exists a difference between the current abilities of the NMOS transistors M3, M4, a current (I1) flowing through the NMOS transistor M3 becomes larger than a current (I2) flowing through the NMOS transistor M4, so that the balance between quantities of current passing through the left/right circuits is lost.

At this time, the OP amplifier 120 is operated by negative feedback control to contract the unbalance between these currents I1, I2.

That is, in the current mirror loads M1, M2, an output current (=I1) equal to the input current (=I1) is sent out from the NMOS transistor M2. On the other hand, a current that the NMOS transistor M4 constituting the differential pair is able to suck up is only a current that is equivalent to the current I2.

Accordingly, a difference I4 (=I1−I2) between the current I1 and the current I2 leaks out to the outside of the differential circuit via a negative feedback loop (including the closed switch SW1), and thus the capacitor C1 is charged. Hence, a gate voltage of the NMOS transistor M4 is increased.

In other words, the gate potential of the NMOS transistor M4 increases to cause the larger current to flow through the NMOS transistor M4 whose current ability is low. When respective currents flowing through the NMOS transistors M3, M4 constituting the differential pair become equal (i.e., when I1=I2 is satisfied and thus current quantities in the left/right circuits are balanced), an increase of the gate potential of the NMOS transistor M4 is stopped.

As a result, the gate potential of the NMOS transistor M4 becomes higher than the gate potential of the NMOS transistor M3, and thus a potential difference (equivalent to the DC offset (DCoff) of the OP amplifier 120) is produced across the capacitor C1.

Figure 16:
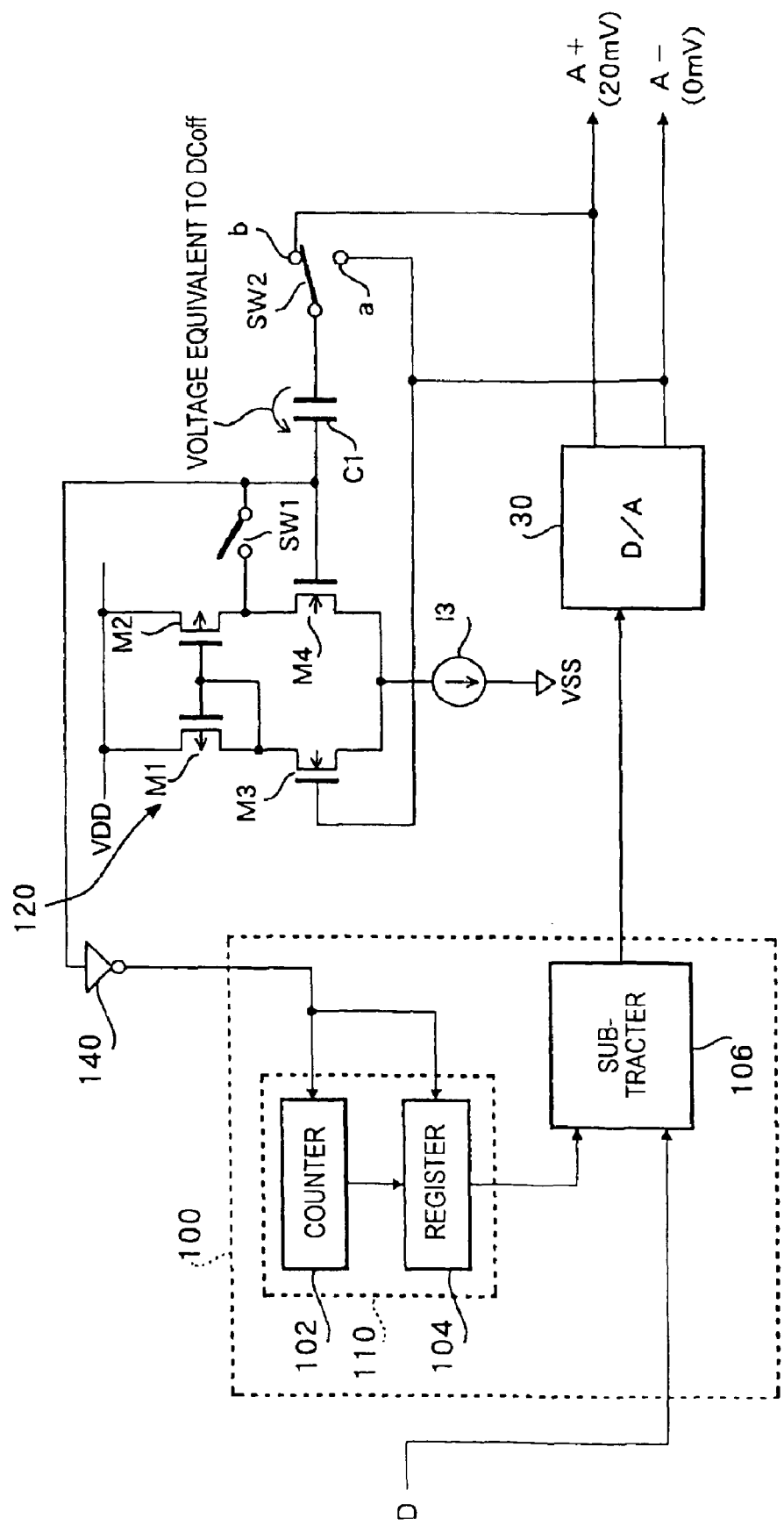
FIG. 16 is a circuit diagram explaining a particular configuration and operation (operation of measuring the DC offset of the D/A converter while canceling the DC offset of the comparator) of an example of the D/A converting device with the offset compensation function of the present invention, in which the offset compensation function is given to the comparator itself.

Then, as shown in FIG. 16, the negative feedback loop of the OP amplifier 120 is eliminated by switching off the first switch SW1. Also, the contact of the second switch SW2 is switched to the terminal "b" side.

Then, the voltage of A+ is applied to an end (to which the voltage of A− is applied up to now) of the capacitor C1 on the second switch SW2 side.

At this time, a voltage ((A+)+DCoff) derived by adding the DC offset DCoff of the OP amplifier 120 itself to A+ is applied to the gate of the NMOS transistor M4 (the inverting terminal of the OP amplifier 120). That is, the corrected input analog voltage is input into the inverting terminal of the OP amplifier 120.

As described above, the current ability of the NMOS transistor M4 is smaller than that of the NMOS transistor M3. For this reason, the voltage applied to the inverting terminal to overcome the unbalance between the left/right currents caused by the above current abilities is the voltage equivalent to "DCoff".

Therefore, if the voltage equivalent to DCoff is added to the input voltage (A+) previously, the unbalance between the left/right currents of the differential circuit in the OP amplifier 120 can be canceled automatically.

Namely, the DC offset of the OP amplifier 120 itself is masked and disappears. Thus, such DC offset of the OP amplifier 120 is canceled.

In this situation, an operation for acquiring the compensation value to compensate the DC offset between the differential outputs of the D/A converter 30 begins by starting an operation of the counter 102.

Because the DC offset of the OP amplifier (comparator) 120 itself is canceled, the DC offset between the differential outputs of the D/A converter is measured precisely. Thus, the compensation value is calculated based on the measured DC offset.

As a result, the compensation value can be generated with high precision by eliminating the influence of the DC offset of the OP amplifier 120 itself.

Above operations will be explained briefly in bulk with reference to FIGS. 17A to 17C and FIGS. 18A to 18F hereunder.

Figure 17A:
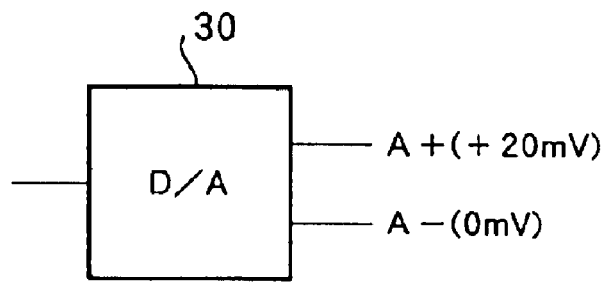
FIG. 17A is a view showing the DC offset generated between the differential outputs of the D/A converter.

As shown in FIG. 17A, now the issue is how the DC offset between the differential outputs (A−, A+) of the D/A converter 30 should be measured exactly.

In essence, both the differential outputs (A−, A+) should be 0 mV, nevertheless A+ becomes 20 mV (A− is 0 mv). As a result, the offset 20 mV between the differential outputs is generated.

The offset of the OP amplifier (comparator) itself must be canceled before the offset of this D/A converter 30 is measured.

Suppose such a case that no DC offset exists in the OP amplifier (comparator) itself.

Figure 17B:
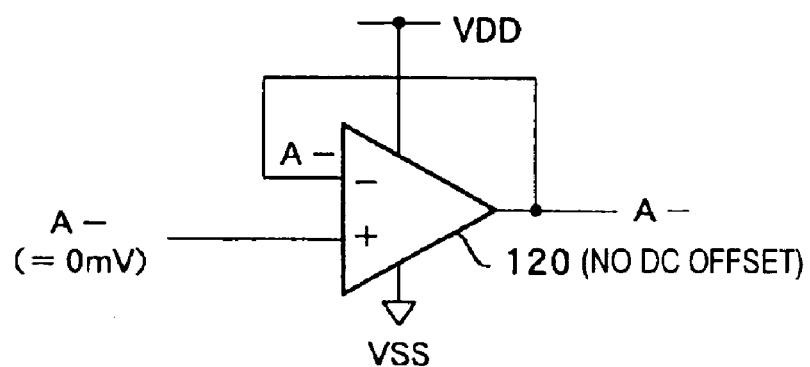
FIG. 17B is a view showing potentials of respective portions when an OP amplifier having no DC offset is constructed as a voltage follower.

As shown in FIG. 17B, when the OP amplifier without DC offset is constructed as a voltage follower and then A−(=0 mV) is input into the non-inverting terminal, the inverting terminal also becomes A− because of the virtual ground. Thus, the output of the OP amplifier 120 also becomes A−.

Figure 17C:
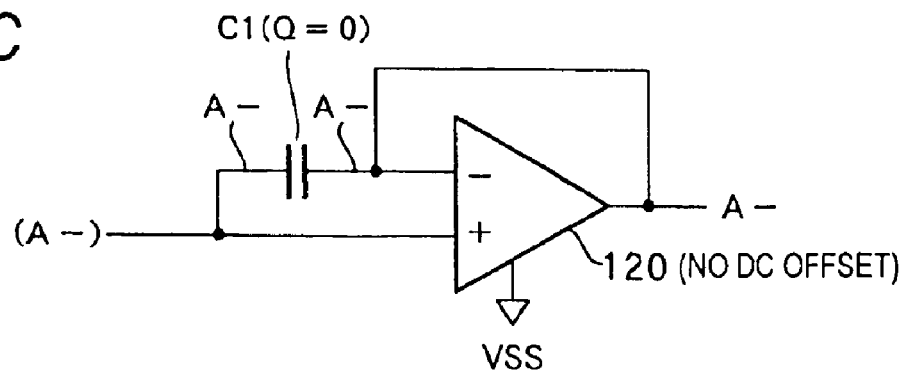
FIG. 17C is a view showing a mode in which a capacitor is connected to an inverting terminal of the OP amplifier constructed as the voltage follower.

Here, as shown in FIG. 17C, when one end of the capacitor C1 is connected to the inverting terminal of the OP amplifier 120 and another end thereof is connected to the non-inverting terminal, potentials of both ends of the capacitor C1 are A− respectively. Thus, no potential difference is produced.

Then, as shown in FIG. 18A, suppose such a case that the DC offset exists in the OP amplifier 120 itself.

The event that the DC offset exists in the OP amplifier 120 itself signifies that, as shown in FIG. 18B, respective magnitudes of the left current I1 and the right current I2 in the differential circuit are different mutually when both the inverting terminal and the non-inverting terminal are set to the same potential (=A−). Where, I1>I2.

Then, as shown in FIG. 18C, the OP amplifier is constructed as the voltage follower.

At this time, as shown in the lower side of FIG. 18C indicated and enclosed with a dotted line, the voltage of the inverting terminal of the OP amplifier 120 rises so as to eliminate the unbalance between the currents I1 and I2. In FIG. 18C, this increased voltage is depicted as "α". This α corresponds to the DC offset DCoff of the OP amplifier 120 itself.

Now, when the configuration shown in FIG. 18D is given, a potential difference corresponding to the voltage α is generated across the capacitor C1. Where, α=Q/C (Q: charge, C: capacitance of the capacitor C1).

Then, as shown in FIG. 18E, the input voltage into the inverting terminal of the OP amplifier 120 is switched from A− (=0 mV) to A+ (=20 mV). In this case, the potential difference corresponding to the voltage α is still held in the capacitor C1.

Then, α is added to the essential input A+ at the inverting terminal of the OP amplifier 120. As a result, the input analog voltage into the inverting terminal is corrected.

This voltage α is the voltage that is required to eliminate the unbalance between the left/right currents of the differential circuit in the OP amplifier 120 (i.e., the voltage equivalent to "DCoff"), as being shown in FIG. 18C. Accordingly, the DC offset of the OP amplifier 120 can be canceled automatically by adding this voltage α to the input analog voltage previously.

In this case, since A+(=20 mV) is input into the inverting terminal of the OP amplifier 120 in FIG. 18E, the polarity of the output the OP amplifier 120 is inverted.

Therefore, as shown in FIG. 18F, the inverter 140 inverts the polarity. As a result, the DC offset "+20 mV" between the differential outputs of the D/A converter 30 (see FIG. 17A) can be decided precisely.

Then, the compensation value is calculated by precisely deciding the DC offset between the differential outputs of the D/A converter 30. As a consequence, the DC offset between the differential outputs of the D/A converter 30 can be compensated exactly.

In this manner, in the present embodiment, the input voltage is increased (or decreased) by utilizing the capacitor, which is connected to the inverting terminal of the OP amplifier, as the bootstrap capacitor.

Here, in the present embodiment, what is to be noted is such an aspect that the voltage is not simply increased or decreased but an amount of change in the voltage is agree with the DC offset of the OP amplifier itself and accordingly the analog voltage to be input into the non-inverting terminal of the OP amplifier is previously corrected to cancel the DC offset of the OP amplifier.

That is to say, in the present embodiment, the capacitor functions as a means for correcting the input voltage of the inverting terminal. In addition, as explained with reference to FIG. 14 to FIG. 18F, such operation can be implemented only by the simple control, i.e., by switching the switch cleverly.

Also, the configuration of the present embodiment can be achieved by adding the capacitor and the switch to the OP amplifier. Thus, the structure is very simple, and the implementation is facilitated.

Features of the present embodiment explained as above are summarized as shown in FIGS. 19A to 19F.

The compensation value applied when the DC offset compensation of the OP amplifier is not carried out (the compensation value used to compensate the DC offset of the D/A converter) will be explained with reference to FIG. 19A to 19C hereunder.

Figure 19A:
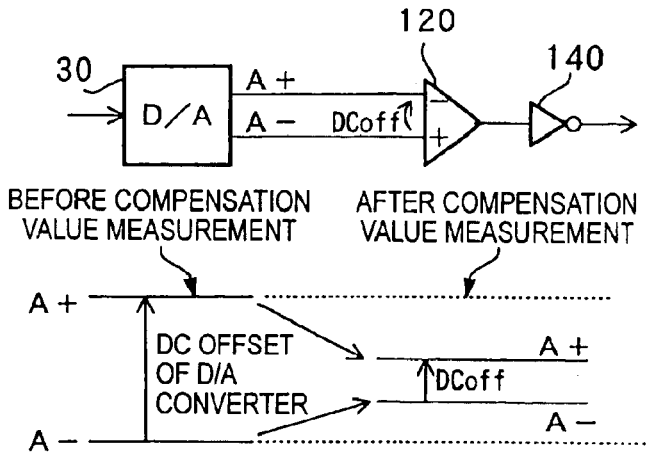
FIG. 19A is a view showing circuit connections when the DC offset compensation function is not provided to the comparator used to measure the DC offset between the differential outputs of the D/A converter.

FIG. 19A shows connections among the D/A converter 30, the OP amplifier 120, and the inverter 140 when the OP amplifier 120 has no DC offset compensation function. FIG. 19B shows potentials of the outputs A+, A− of the D/A converter 30 before the compensation value measurement and potentials of the outputs A+, A− of the D/A converter 30 after the compensation value measurement.

In this case, as shown in FIG. 19C, "the DC offset compensation value×2LSB (LSB is equivalent to 1 mV)" becomes "the DC offset of the D/A converter−the DC offset (DCoff) of the OP amplifier", and therefore an error of "DCoff amount" generates.

Next, the compensation value applied when the DC offset compensation of the OP amplifier 120 is carried out (the compensation value used to compensate the DC offset of the D/A converter 30) will be explained with reference to FIGS. 19D to 19F hereunder.

Figure 19D:
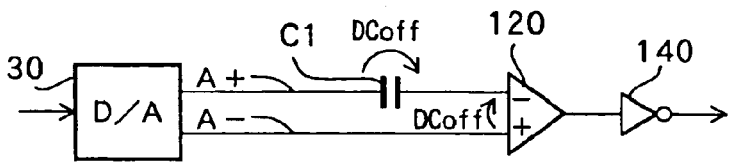
FIG. 19D is a view showing circuit connections when the DC offset compensation function is provided to the comparator used to measure the DC offset between the differential outputs of the D/A converter.
Figure 19E:
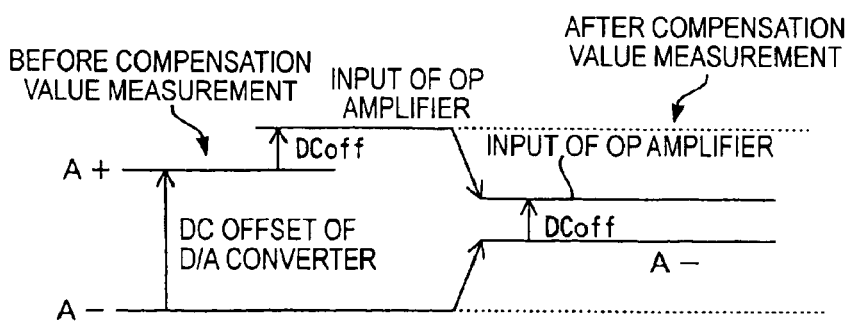

FIG. 19D shows connections among the D/A converter 30, the capacitor C1, the OP amplifier 120, and the inverter 140 when the OP amplifier 120 has the DC offset compensation function. FIG. 19E shows potentials of the outputs A+, A− of the D/A converter 30 and respective potentials of the inputs of the OP amplifier 120 before the compensation value measurement and respective potentials of the inputs of the OP amplifier 120 after the compensation value measurement.

In this case, as shown in FIG. 19F, "the DC offset compensation value×2LSB" becomes "the DC offset of the D/A converter 30+the DC offset (DCoff) of the OP amplifier 120−DCoff". Thus, the DC offset of the OP amplifier 120 is canceled and only the DC offset of the D/A converter 30 itself is given. As a result, the DC offset of the D/A converter 30 can be measured exactly.

(Eighth Embodiment)

Figure 20:
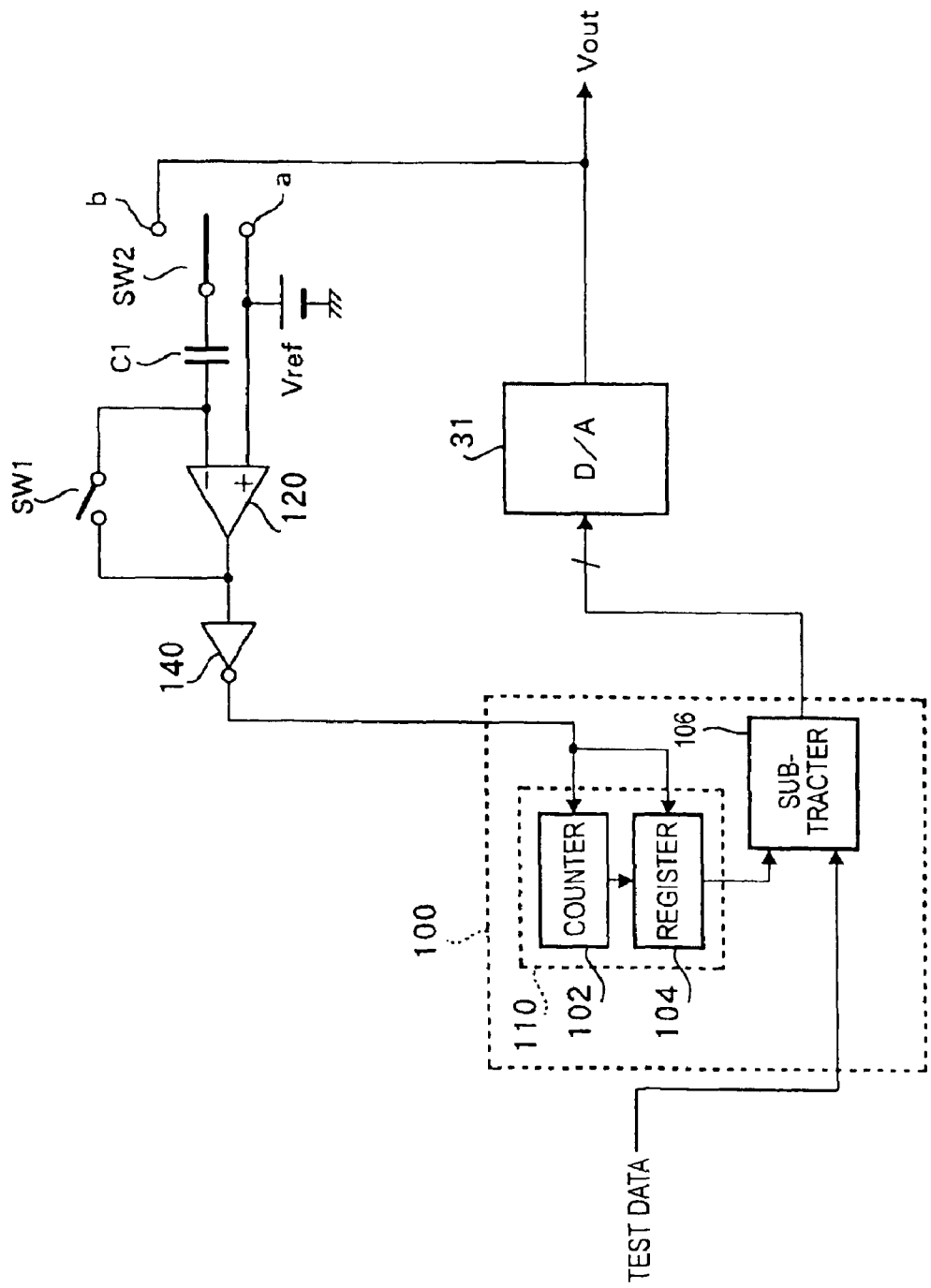
FIG. 20 is a view showing an overall configuration of another example of the D/A converting device with the offset compensation function of the present invention, in which the offset compensation function is given to the comparator itself.

FIG. 20 shows a configuration in which an output voltage Vout of a single output type D/A converter 31 is compared with a reference voltage (corresponding to the output voltage of the ideal the D/A converter 31).

A basic configuration is identical to those in above embodiments. But the eighth embodiment is different from the above embodiments in that the non-inverting input terminal of the OP amplifier 120 is connected to the reference voltage (Vref). Assume that the output voltage Vout of the D/A converter 31 is the non-inverting output with respect to the digital input data.

Principally an operation of the present embodiment is similar to the operation of the seventh embodiment. However, as explained beforehand, the present embodiment is different in that the compensation value of the single output type D/A converting device is twice the compensation value of the differential output type D/A converting device.

The DC offset compensation values when the OP amplifier 120 has no DC offset compensation function and the OP amplifier 120 has the DC offset compensation function will be explained with reference to FIGS. 21A to 21F hereunder.

FIG. 21A shows connections among the D/A converter 31, the OP amplifier 120, and the inverter 140 when the OP amplifier 120 has no DC offset compensation function. FIG. 21B shows potential of the output Vout of the D/A converter 31 and potential of Vref before the compensation value measurement and potential of the output Vout and potential of Vref after the compensation value measurement.

At this time, as shown in FIG. 21C, "the DC offset compensation value×LSB" becomes "the DC offset of the D/A converter 31−the DC offset of the OP amplifier 120 (DCoff)", and therefore an error of "DCoff amount" is generated.

FIG. 21D shows connections among the D/A converter 31, the capacitor C1, the OP amplifier 120, and the inverter 140 when the OP amplifier 120 has the DC offset compensation function. FIG. 21E shows potential of the output Vout of the D/A converter 31, potential of Vref, and input potential of the OP amplifier 120 before the compensation value measurement, and input potential of the OP amplifier 120 after the compensation value measurement.

Therefore, as shown in FIG. 21F, "the DC offset compensation value×LSB" can be expressed as "the DC offset of the D/A converter+the DC offset of the OP amplifier (Dcoff)−DCoff". Since the DC offset of the OP amplifier 120 is canceled, the DC offset of the D/A converter 31 itself is given. As a result, the DC offset of the D/A converter 31 can be measured exactly.

The D/A converting device with the offset compensation function according to the present invention can be employed not only for the communication application but also for the audio device, etc.

As explained as above, according to the D/A converting device with the offset compensation function and the method of compensating the offset of the D/A converting device, even though the DC offset exists in the comparator itself, the DC offset of the D/A converter can be removed substantially perfectly. Also, it is possible to be simple in configuration and also simple in its control method, and therefore the present invention can be implemented readily.

In addition, as the miniaturization of the analog circuit is accelerated, the DC offset of the comparator is increased more and more. Therefore, the D/A converting device is highly effective for the means for implementing the D/A converter from which the DC offset is removed substantially perfectly by the fine pattern processing.

What is claimed is:

1. A D/A converting device with an offset compensation function for compensating a DC offset of a D/A converter, comprising:

a comparator for detecting the DC offset of the D/A converter;

a changing switch for selecting a first input mode in which first and second signals, wherein at least one of these signals is an output signal of the D/A converter, are input into first and second input terminals of the comparator respectively, and a second input mode in which the second and first signals are input into the first and second terminals of the comparator respectively; and input data correcting means for calculating a third compensation value from a first compensation value which is obtained based on an output signal of the comparator in the first input mode and a second compensation value which is obtained based on an output signal of the comparator in the second input mode, and also correcting input data of the D/A converter by using the third compensation value, wherein the input data correcting means determines the first and second compensation values by using a successive approximation method, wherein the input data correcting means determines the first and second compensation values by using the successive approximation method based on a binary search, and wherein the input data correcting means adds ½ to the first and second compensation values when least significant bits of the first and second compensation values are 0, and subtracts ½ from the first and second compensation values when the least significant bits of the first and second compensation values are 1.

2. The D/A converting device with the offset compensation function according to claim 1, wherein the D/A converter is of single output type, and one of the first and second signals is the output signal of the D/A converter, and another thereof has a predetermined reference voltage.

* * * * *